US009335385B2

(12) United States Patent
Lanting et al.

(10) Patent No.: US 9,335,385 B2
(45) Date of Patent: May 10, 2016

(54) SYSTEMS, METHODS AND APPARATUS FOR MEASURING MAGNETIC FIELDS

(71) Applicant: D-Wave Systems Inc., Burnaby (CA)

(72) Inventors: Trevor Michael Lanting, Vancouver (CA); Paul I. Bunyk, Vancouver (CA); Andrew J. Berkley, Vancouver (CA); Richard G. Harris, North Vancouver (CA); Sergey V. Uchaykin, Burnaby (CA); Andrew Brock Wilson, Burnaby (CA); Mark Johnson, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 242 days.

(21) Appl. No.: 14/462,200

(22) Filed: Aug. 18, 2014

(65) Prior Publication Data

US 2015/0346291 A1 Dec. 3, 2015

Related U.S. Application Data

(63) Continuation of application No. 12/991,893, filed as application No. PCT/US2009/060026 on Oct. 8, 2009, now Pat. No. 8,812,066.

(60) Provisional application No. 61/104,179, filed on Oct. 9, 2008, provisional application No. 61/139,983, filed on Dec. 22, 2008.

(51) Int. Cl.
*G01R 33/00* (2006.01)
*G01R 33/035* (2006.01)

(52) U.S. Cl.
CPC ........ *G01R 33/0354* (2013.01); *G01R 33/0017* (2013.01); *G01R 33/0094* (2013.01)

(58) Field of Classification Search
CPC .................................. G01R 33/0017–33/0354
See application file for complete search history.

(56) References Cited

U.S. PATENT DOCUMENTS 7,533,068 B2 5/2009 Maassen van den Brink et al.
8,812,066 B2 8/2014 Lanting et al.
(Continued)

FOREIGN PATENT DOCUMENTS

JP 2001-127352 A 5/2001
JP 2001127352 * 5/2001
(Continued)

OTHER PUBLICATIONS

International Search Report mailed Apr. 30, 2010, for International Application No. PCT/US2009/060026, 3 pages.
(Continued)

*Primary Examiner* — Colleen Dunn
(74) *Attorney, Agent, or Firm* — Seed IP Law Group PLLC

(57) ABSTRACT

SQUIDs may detect local magnetic fields. SQUIDS of varying sizes, and hence sensitivities may detect different magnitudes of magnetic fields. SQUIDs may be oriented to detect magnetic fields in a variety of orientations, for example along an orthogonal reference frame of a chip or wafer. The SQUIDS may be formed or carried on the same chip or wafer as a superconducting processor (e.g., a superconducting quantum processor). Measurement of magnetic fields may permit compensation, for example allowing tuning of a compensation field via a compensation coil and/or a heater to warm select portions of a system. A SQIF may be implemented as a SQUID employing an unconventional grating structure. Successful fabrication of an operable SQIF may be facilitated by incorporating multiple Josephson junctions in series in each arm of the unconventional grating structure.

21 Claims, 13 Drawing Sheets

(56) References Cited

U.S. PATENT DOCUMENTS

| | | |
|---|---|---|
| 2004/0239319 A1 | 12/2004 | Tralshawala et al. |
| 2007/0096730 A1 | 5/2007 | Meyer et al. |
| 2007/0241747 A1 | 10/2007 | Morley et al. |
| 2008/0176750 A1 | 7/2008 | Rose et al. |
| 2009/0121215 A1 | 5/2009 | Choi |
| 2009/0122508 A1 | 5/2009 | Uchaykin et al. |
| 2009/0168286 A1 | 7/2009 | Berkley et al. |
| 2010/0097056 A1* | 4/2010 | Lam .................. G01R 33/0358 324/228 |

FOREIGN PATENT DOCUMENTS

| | | | |
|---|---|---|---|
| WO | 2008/022410 | * | 2/2008 |
| WO | 2008/022410 A1 | | 2/2008 |
| WO | 2009/099972 A2 | | 8/2009 |
| WO | 2009/120638 A2 | | 10/2009 |
| WO | 2010/042735 A2 | | 4/2010 |

OTHER PUBLICATIONS

Lanting et al., "Systems, Methods and Apparatus for Measuring Magnetic Fields," U.S. Appl. No. 61/104,179, filed Oct. 9, 2008, 49 pages.

Oppenländer et al., "Non-$\Phi_0$-periodic Macroscopic Quantum Interference in One-Dimensional Parallel Josephson Junction Arrays With Unconventional Grating Structure," *Physical Review B* 63:024511-1-024511-9, 2000.

Pobell, *Matter and Methods at Low Temperatures*, Second Edition, Chapter 7, "The $^3$He-$^4$He Dilution Refrigerator," Springer-Verlag Berlin Heidelberg, 1996, pp. 120-156.

Wilson et al., "Systems, Methods and Apparatus for Measuring Magnetic Fields," U.S. Appl. No. 61/139,983, filed Dec. 22, 2008, 24 pages.

Written Opinion mailed Apr. 30, 2010, for International Application No. PCT/US2009/060026, 5 pages.

* cited by examiner

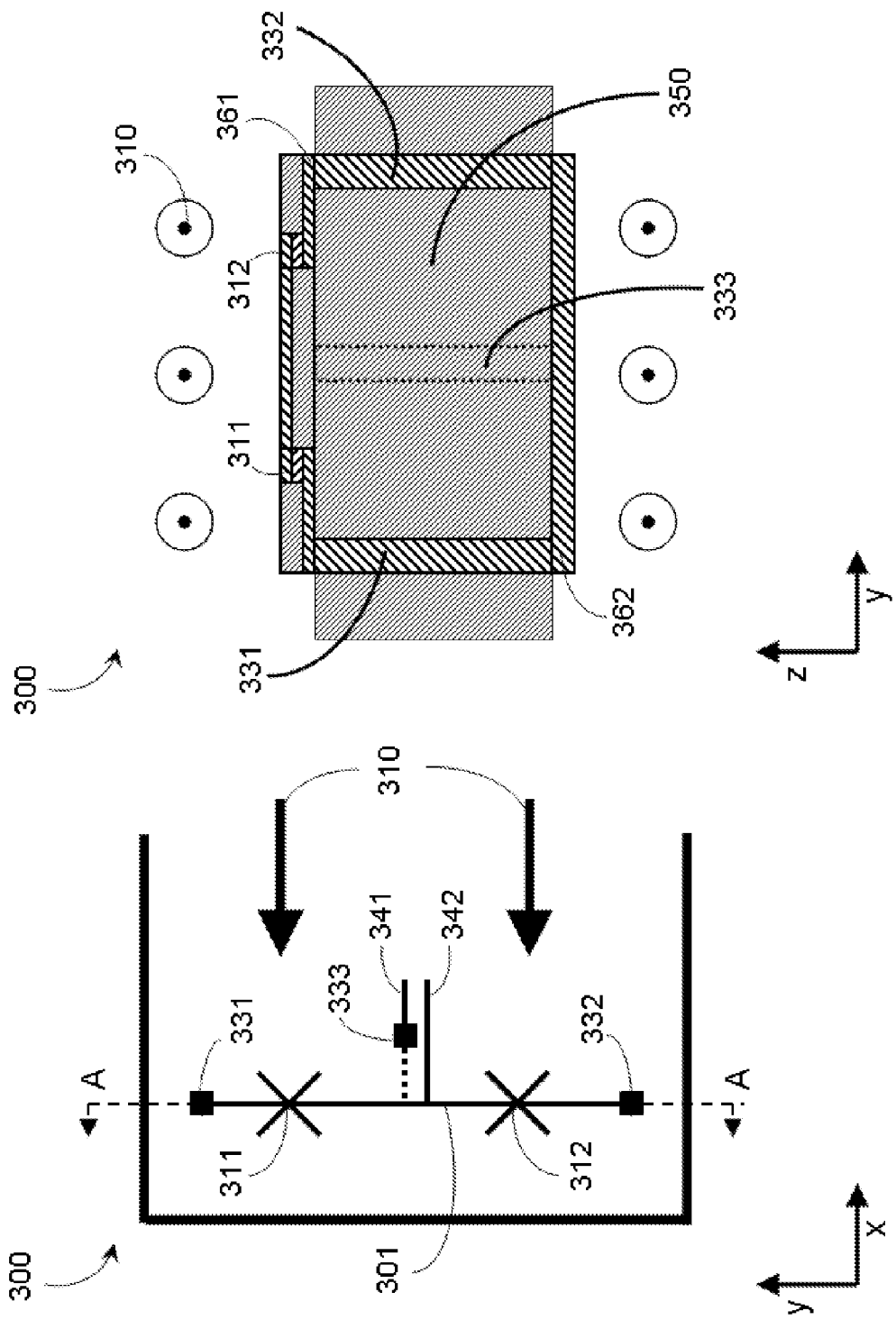

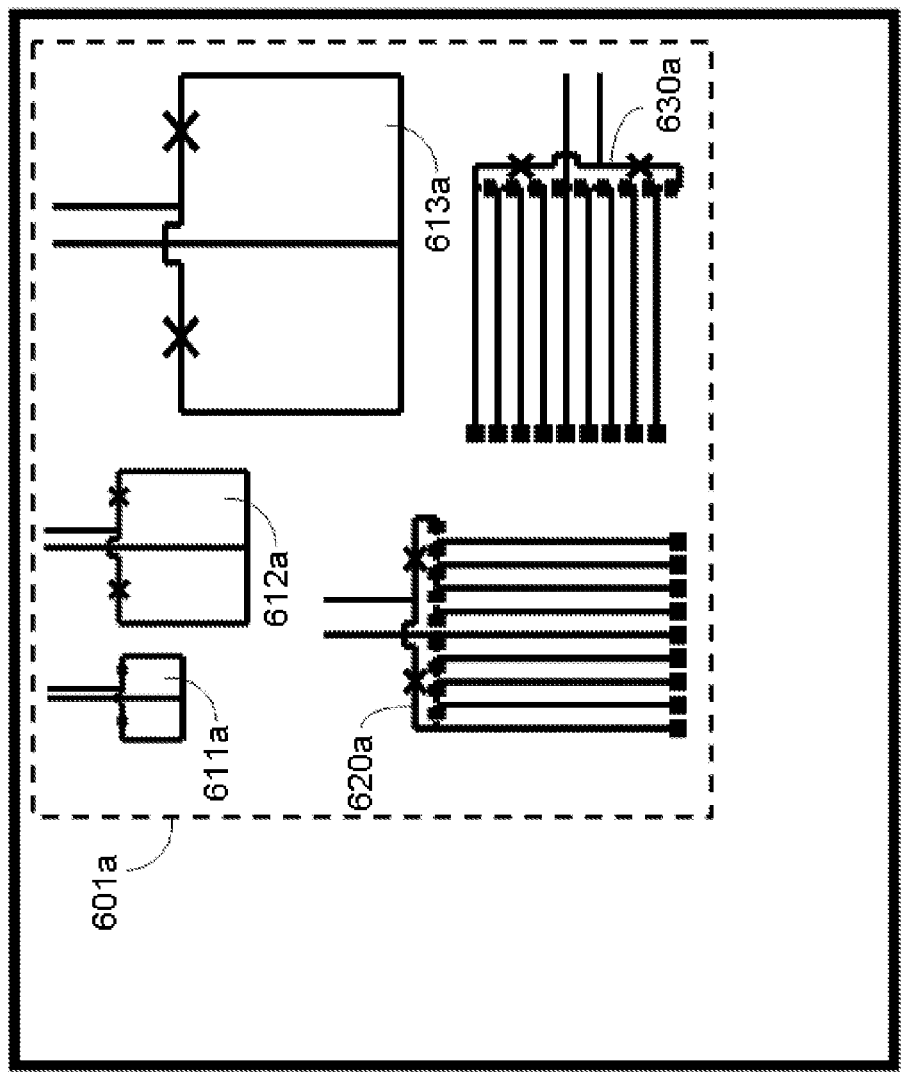
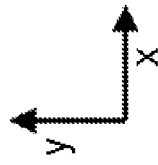
FIGURE 6A

SYSTEMS, METHODS AND APPARATUS FOR MEASURING MAGNETIC FIELDS

BACKGROUND

Field

The present systems, methods and apparatus generally relate to the measurement of magnetic fields and particularly relate to integrated devices for the measurement of magnetic fields for the purpose of shielding and field compensation.

Superconducting Qubits

There are many different hardware and software approaches under consideration for use in quantum computers. One hardware approach employs integrated circuits formed of superconducting material, such as aluminum and/or niobium, to define superconducting qubits. Superconducting qubits can be separated into several categories depending on the physical property used to encode information. For example, they may be separated into charge, flux and phase devices. Charge devices store and manipulate information in the charge states of the device; flux devices store and manipulate information in a variable related to the magnetic flux through some part of the device; and phase devices store and manipulate information in a variable related to the difference in superconducting phase between two regions of the phase device.

Many different forms of superconducting flux qubits have been implemented in the art, but all successful implementations generally include a superconducting loop (i.e., a "qubit loop") that is interrupted by at least one Josephson junction. Some embodiments implement multiple superconducting loops connected in series and/or in parallel with one another. Some embodiments implement multiple Josephson junctions connected either in series or in parallel with one another. In the art, a pair of Josephson junctions that are connected in parallel with one another is known as a compound Josephson junction ("CJJ"). It is understood that the behavior of a CJJ may be modeled as a single effective Josephson junction, similar to the way in which the behavior of multiple resistors connected in parallel with one another may be modeled as a single effective resistance.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in U.S. Pat. No. 7,533,068, US Patent Publication 2008-0176750, US Patent Publication 2009-0121215, and PCT Patent Application Serial No. PCT/US2009/037984.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

Refrigeration

According to the present state of the art, a superconducting material may generally only act as a superconductor if it is cooled below a critical temperature that is characteristic of the specific material in question. For this reason, those of skill in the art will appreciate that a computer system that implements superconducting processors may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of refrigeration system.

BRIEF SUMMARY

A system for measuring magnetic fields in a local environment of a device may be summarized as including a first superconducting quantum interference device ("SQUID") comprising a closed superconducting current path formed by a planar loop of material that is superconducting below a critical temperature, wherein the closed superconducting current path is interrupted by at least one Josephson junction; and wherein the first SQUID is integrated into the device such that the first SQUID is carried on a predominately planar surface of the device and the first SQUID is responsive to magnetic fields in the local environment of the device that are orthogonal to the predominately planar surface. The device may include a superconducting processor chip. The superconducting processor chip may include a superconducting quantum processor.

The system may further include a controllable heater positioned sufficiently proximate the device to enable controlled transfer of thermal energy from the controllable heater to the device. The controllable heater may include at least one of an LED and a resistor.

The system may further include a tube that is formed of a material that is superconducting below a critical temperature, wherein the tube includes an internal cavity and the device is positioned inside the internal cavity such that the tube substantially encloses the device. The critical temperature of the first SQUID may be higher than the critical temperature of the tube.

The system may further include at least one compensation coil formed by a coil of conductive wire, wherein at least a portion of the tube is enclosed within a perimeter of the at least one compensation coil; and a computerized system that includes at least one current source that is electrically coupled to the at least one compensation coil for use in controllably directing electrical current through the at least one compensation coil to generate a compensation field. The computerized system may be electrically coupled to the first SQUID for use in reading out the first SQUID.

The system may further include a second SQUID comprising a closed superconducting current path formed by a planar loop of material that is superconducting below a critical temperature, wherein the closed superconducting current path of the second SQUID is interrupted by at least one Josephson junction and wherein the second SQUID is integrated into the device such that the second SQUID is carried on a planar surface of the device; and wherein the closed superconducting current path of the first SQUID encloses a first planar area and the closed superconducting current path of the second SQUID encloses a second planar area. The second planar area may be larger than the first planar area. The planar loop of the first SQUID and the planar loop of the second SQUID may be substantially parallel. The planar loop of the first SQUID and the planar loop of the second SQUID may be substantially co-planar.

The system may further include a third SQUID that is planar and integrated into the device such that the third SQUID is carried on a planar surface of the device.

The system may further include at least one additional SQUID that is integrated into the device, wherein the at least one additional SQUID includes at least one planar superconducting loop that is in a plane that is substantially perpendicular to the planar loop of the first SQUID.

A superconducting quantum interference device ("SQUID") for measuring magnetic fields in the local environment of a device may be summarized as including a closed superconducting current path including a first planar loop of material that is superconducting below a critical temperature, wherein the closed superconducting current path is interrupted by at least one Josephson junction and wherein the SQUID is integrated into the device such that the first planar loop comprises: a first segment of the closed superconducting current path that is carried on a first layer of the device, a second segment of the closed superconducting current path that is carried on a second layer of the device, and a third and a fourth segment of the closed superconducting current path, each of which traverses between the first and the second layers of the device and electrically connects the first and the second segments of the closed superconducting current path together. The first layer of the device may be a first outer surface of the device. The second layer of the device may be a second outer surface of the device that is opposite the first outer surface of the device. The closed superconducting current path may include a number of superconducting traces formed by a lithographic process, and wherein the third and the fourth segments of the closed superconducting current path may each include a respective superconducting via. The first planar loop may be substantially orthogonal to a longitudinal axis of the device. The first planar loop may be substantially orthogonal to a transverse axis of the device.

In some embodiments, the closed superconducting current path of the SQUID may further include a second planar loop of material that is superconducting below a critical temperature, wherein the second planar loop is formed by a fifth segment of the closed superconducting current path that is carried on the first layer of the device, a sixth segment of the closed superconducting current path that is carried on the second layer of the device, and a seventh and an eighth segment of the closed superconducting current path, each of which traverses between the first and the second layers of the device and electrically connects the fifth and the sixth segments of the closed superconducting current path together. The second planar loop may be co-axially aligned with the first planar loop.

In some embodiments, the closed superconducting current path of the SQUID may further include at least one additional planar loop of material that is superconducting below a critical temperature, wherein the first planar loop, the second planar loop, and the at least one additional planar loop are all co-axially aligned.

A method of establishing tuned compensation fields in a local environment surrounding a system may be summarized as including cooling the system, wherein the system includes at least one superconducting quantum interference device ("SQUID") and cooling the system includes cooling the system below a critical temperature of the at least one SQUID; measuring a magnetic field in the local environment using the at least one SQUID; applying an electrical current through at least one compensation coil that is at least partially wrapped around a perimeter of the local environment, wherein the electrical current generates a compensation field; measuring an effect of the compensation field in the local environment using the at least one SQUID; locally heating a portion of the system above a critical temperature of at least one superconducting component in the system by activating a controllable heater, thereby releasing a magnetic flux trapped by the at least one superconducting component in the system; re-cooling the system; tuning the compensation field by adjusting the electrical current through the at least one compensation coil; and measuring an effect of tuning the compensation field using the at least one SQUID. Adjusting the electrical current through the at least one compensation coil may include operating a computerized system to adjust the electrical current through the at least one compensation coil. Measuring an effect of tuning the compensation field using the at least one SQUID may include reading out the measurements made using the at least one SQUID via the computerized system. Locally heating a portion of the system may include activating a local controllable heater. The method may further include repeating the locally heating, re-cooling, tuning, and measuring as necessary until a desired effect of tuning the compensation field is attained.

The method may further include further cooling the system below a critical temperature of a hollow superconducting tube that at least partially encloses the local environment such that the superconducting tube traps the tuned compensation field.

The method may further include deactivating the electrical current through the at least one compensation coil.

At least one embodiment may be summarized as a superconducting quantum interference filter ("SQIF") comprising a first closed superconducting current path having a first arm connected in parallel with a second arm to define a first superconducting loop having a first area; and a second closed superconducting current path having a first arm connected in parallel with a second arm to define a second superconducting loop having a second area that is different from the first area, wherein the second superconducting loop is connected in parallel with the first superconducting loop such that the second arm of the first superconducting loop serves as the first arm of the second superconducting loop; wherein each arm is interrupted by at least two Josephson junctions connected in series with one another. In some embodiments, each arm may be interrupted by a respective first Josephson junction having a first critical current that is connected in series with a respective second Josephson junction having a second critical current, and wherein the second critical current is different from the first critical current The SQIF may further comprise a third closed superconducting current path having a first arm connected in parallel with a second arm to define a third superconducting loop having a third area that is different from both the first area and the second area, wherein the third superconducting loop is connected in parallel with the second superconducting loop such that the second arm of the second superconducting loop serves as the first arm of the third superconducting loop, and wherein each arm is interrupted by at least two Josephson junctions connected in series with one another. In some embodiments, the SQIF may further comprise N additional closed superconducting current paths each respectively having a first arm connected in parallel with a second arm, wherein each of the N additional closed superconducting current paths defines a respective one of N additional superconducting loops each having a respective area, and wherein the area of each of the N additional superconducting loops is different from the first area, the second area, the third area, and each of the other N−1 additional areas; and wherein each of the N additional superconducting loops are connected in parallel with each other and with the first, the second, and the third superconducting loops, and wherein each arm is interrupted by at least two Josephson junctions connected in series with one another.

At least one embodiment may be summarized as a superconducting quantum interference filter ("SQIF") comprising a first superconducting arm that is interrupted by at least two serially-connected Josephson junctions; a second superconducting arm that is interrupted by at least two serially-connected Josephson junctions, wherein the second superconducting arm is connected in parallel with the first superconducting arm to define a first superconducting loop having a first area; and a third superconducting arm that is interrupted by at least two serially-connected Josephson junctions, wherein the third superconducting arm is connected in parallel with the second superconducting arm to define a second superconducting loop having a second area, and wherein the second area is different from the first area. In some embodiments, the at least two serially-connected Josephson junctions that interrupt each arm may include a first Josephson junction having a first critical current and a second Josephson junction having a second critical current that is different form the first critical current.

The SQIF may further comprise a fourth superconducting arm that is interrupted by at least two serially-connected Josephson junctions, wherein the fourth superconducting arm is connected in parallel with the third superconducting arm to define a third superconducting loop having a third area, and wherein the third area is different from both the first and second areas. In some embodiments, the SQIF may further comprise N additional superconducting arms, wherein each of the N additional superconducting arms is respectively interrupted by at least two serially-connected Josephson junctions, and wherein each of the N additional superconducting arms is connected in parallel with the first, second, third, and fourth superconducting arms and with the other N−1 additional superconducting arms to define N additional superconducting loops each having a respective area that is different from the first area, the second area, the third area, and each of the other N−1 additional areas.

At least one embodiment may be summarized as a superconducting quantum interference filter ("SQIF") comprising a first node; a second node; and a number N of superconducting current paths where N is greater than 2, each of the N superconducting current paths extending electrically parallel to one another between the first node and the second node to enclose N−1 areas between pairs of successively adjacent ones of the N superconducting current paths, and where an amount of area enclosed between each pair of successively adjacent ones of the N superconducting current paths is different from an amount of area enclosed by the other pairs of successively adjacent ones of the N superconducting current paths, each of the N superconducting current paths respectively including at least two Josephson junctions electrically coupled in series with one another. In some embodiments, for each of the N superconducting current paths, each of the at least two Josephson junctions electrically coupled in series with one another may have a respective critical current that is different from a respective critical current of the other Josephson junctions electrically coupled in series with one another in the respective superconducting current path.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 3A is a schematic diagram of an embodiment of a portion of a processor chip in which is integrated a SQUID for measuring magnetic fields in a transverse or longitudinal direction.

FIG. 3B shows a sectional view of the processor chip of FIG. 3A taken along the section line A-A.

FIG. 6A is a schematic diagram of an embodiment of a processor chip including an on-chip system for measuring local magnetic fields in three directions.

DETAILED DESCRIPTION

Figure 1:
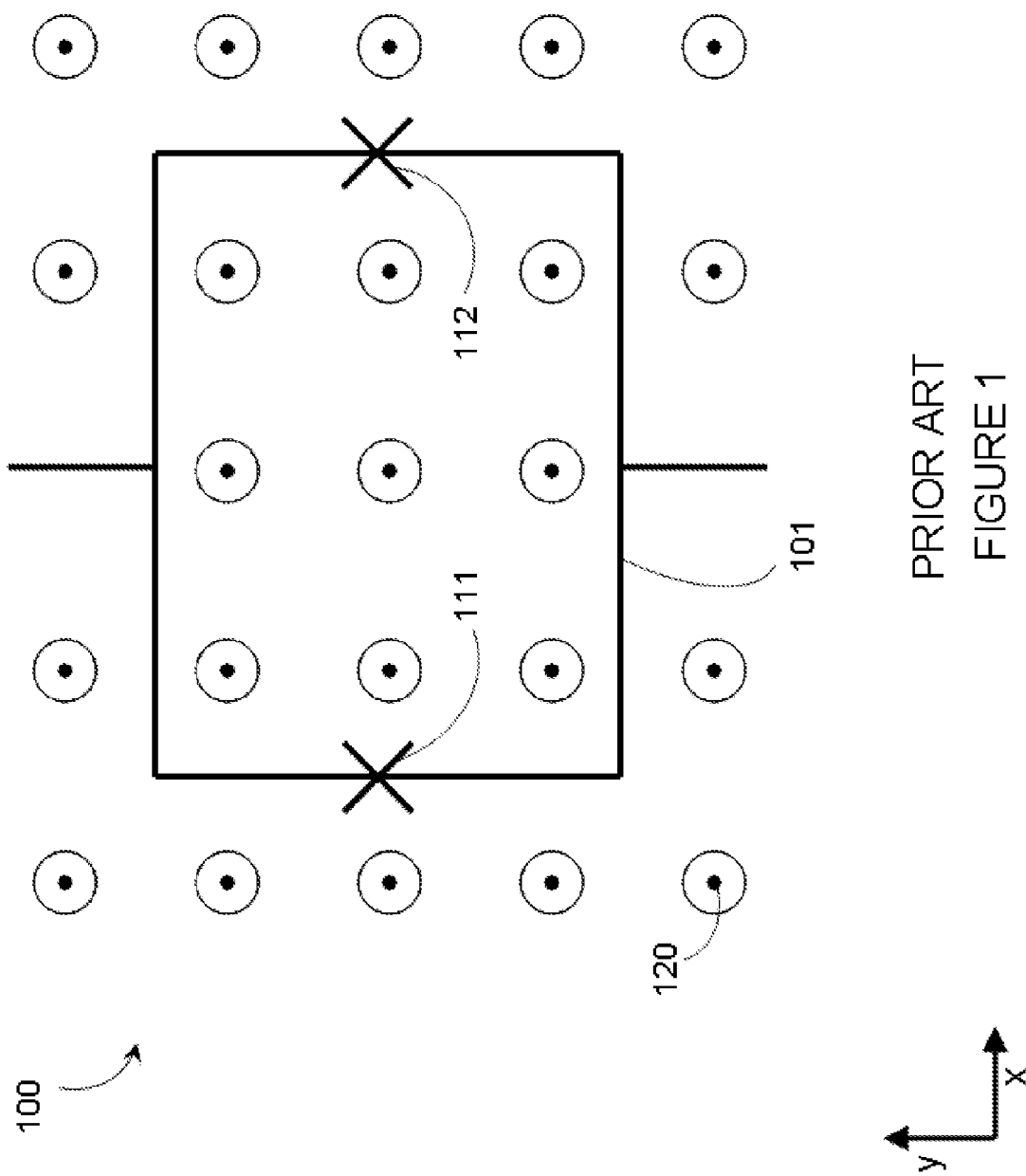
FIG. 1 is a schematic diagram of an exemplary SQUID comprising a closed superconducting loop that is interrupted by two Josephson junctions.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, coupling devices, and control systems including microprocessors and drive circuitry have not been shown or described in detail to avoid unnecessarily obscuring descriptions of the embodiments of the present systems, methods and apparatus. Throughout this specification and the appended claims, the words "element" and "elements" are used to encompass, but are not limited to, all such structures, systems and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

The various embodiments described herein provide systems, methods and apparatus for highly localized measurement of magnetic fields in at least any one of three orthogonal spatial dimensions. Such measurements may be desired in systems that are particularly sensitive to magnetic fields, such as systems implementing a superconducting processor and/or a superconducting quantum processor. In such systems, magnetic fields that are of particular interest may be those in the immediate local environment of (i.e., impinging on and/or permeating through) the superconducting (e.g., quantum) processor chip itself. Current approaches to achieving such local measurements generally implement magnetometers (e.g., flux-gate magnetometers, giant magnetoresistance magnetometers, and the like) that are mounted in close proximity to the processor chip. However, these approaches are subject to a number of problems, including: magnetic field gradients can result in discrepancies between the magnetic fields at the measurement device and the magnetic fields at the processor chip when measurements are made even a small distance away from the processor chip; the commonly-used magnetometers (i.e., flux-gate magnetometers and giant magnetoresistance magnetometers) have limited sensitivity and dissipate large amounts of power; and these approaches require dedicated cabling to control the magnetometers. In accordance with the present systems, methods and apparatus, all of these problems may be overcome by measuring the local magnetic fields using at least one superconducting quantum interference device ("SQUID") that is physically integrated with the processor chip.

The various embodiments detailed herein are described as being implemented with a "processor chip" or, simply a "chip." Those of skill in the art will appreciate that, in alternative embodiments, the present systems, methods and apparatus may similarly be applied using other superconducting devices and are not limited to applications involving superconducting processor chips. Specifically, throughout this specification, reference is often made to a SQUID being "on-chip" or "carried by a processor chip." These terms are used to indicate that the SQUID is carried by the device for which measurements of the local magnetic fields are desired. In alternative embodiments, the present systems, methods and apparatus may generally be realized "on-device" or "carried by the device for which measurements of the local magnetic fields are desired."

The use of SQUIDs as magnetometers is well known in the art. These devices are highly sensitive and can reliably measure fields in the B<nT range while dissipating significantly less power than most other magnetometers. In general, a SQUID comprises a superconducting current path that forms a closed superconducting loop and is interrupted by at least one Josephson junction. The SQUID responds to magnetic flux that is present in the closed loop. In many known applications, a specific signal to be measured is directed to the SQUID through an input coil and the SQUID responds to the signal carried by the input coil. In such applications, care is often taken to isolate the SQUID body from local magnetic fields. Conversely, in the various embodiments described herein, the SQUID body itself is deliberately used to measure the local magnetic fields (e.g., without the use of an input coil), and deliberately oriented to be exposed to local fields in various directions.

FIG. 1 shows an exemplary SQUID 100, comprising a closed superconducting loop (e.g., closed superconducting current path) 101 that is interrupted by two Josephson junctions 111 and 112. Superconducting loop 101 is planar and lies, for example upon a dielectric substrate, in the xy-plane. The illustration in FIG. 1 includes magnetic fields lines (only one called out in the Figure) in the z-direction (i.e., illustrated with point of arrow coming out of the page) 120 which are normal to superconducting loop 101. In operation, SQUID 100 provides a measure of the magnetic flux (i.e., magnetic field per area) passing through the area defined by superconducting loop 101. Thus, SQUID 100 responds to magnetic fields that are orthogonal to the plane of superconducting loop 101. In accordance with the present systems, methods and apparatus, the magnetic fields in the z-direction at a processor chip that lies in the xy-plane may be measured very accurately by integrating at least one SQUID on a surface in the xy-plane of the processor chip.

The sensitivity of SQUID 100 depends on a number of factors, including the size of the area of superconducting loop 101. In general, the sensitivity of SQUID 100 becomes coarser as the area of superconducting loop 101 decreases, and the sensitivity of SQUID 100 becomes finer as the area of superconducting loop 101 increases. In some applications, it can be advantageous to enable sensitivity to a wide range of magnetic field strengths. In accordance with the present systems, methods and apparatus, sensitivity to a wide range of magnetic field strengths may be achieved by integrating multiple SQUIDs of different sizes on a processor chip.

Figure 2:
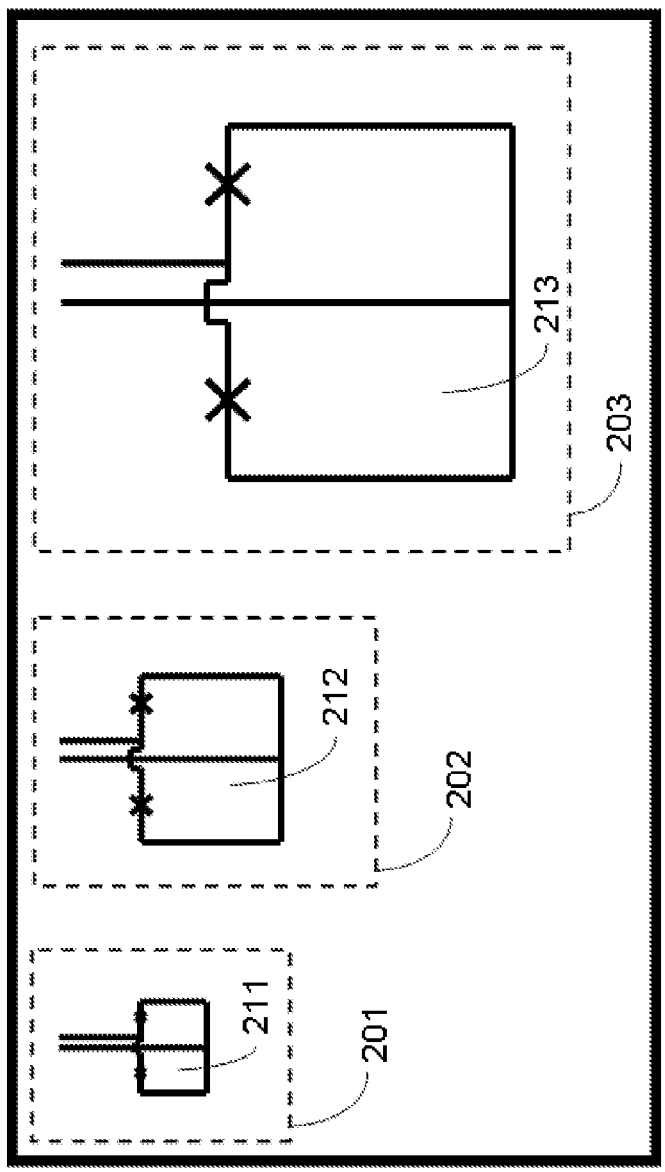
FIG. 2 is a schematic diagram of an embodiment of a portion of a processor chip that includes three SQUIDs.

FIG. 2 shows an embodiment of a portion of a processor chip 200 that includes three SQUIDs 201-203. Chip 200 lies in the xy-plane, with each of SQUIDs 201-203 being carried on a surface in the xy-plane as well. Each of SQUIDs 201-203 includes a respective superconducting loop 211-213, respectively, of a different size. Therefore, each of SQUIDs 201-203 is designed to respond to magnetic fields 210 in the z-direction, but each of SQUIDs 201-203 has a different level of sensitivity. SQUID 201 has a comparatively small superconducting loop 211 and exhibits the coarsest sensitivity; therefore SQUID 201 is the better suited for measuring stronger magnetic fields. SQUID 202 has a medium-sized superconducting loop 212 and exhibits moderate sensitivity; therefore SQUID 202 is the better suited for measuring moderate magnetic fields. SQUID 203 has the largest superconducting loop 213 and exhibits the finest sensitivity; therefore SQUID 203 is the better suited for measuring the weakest magnetic fields. In some embodiments, SQUID 203 may be a washer SQUID. A washer SQUID is a SQUID design that is known in the art to be particularly well-suited to measuring small magnetic fields. In some embodiments, SQUIDs 201-203 may be used in combination to measure fields over a broad range of magnitudes. For example, SQUID 201 may be used to measure stronger residual magnetic fields (e.g., in the range of µT inside a dewar) and SQUID 203 may be used to measure fields in the desired operation range (e.g., typically in the range of nT for a superconducting processor such as a superconducting quantum processor). In such embodiments, SQUID 202 may be used to measure fields in the range in between the sensitivities of SQUIDs 201 and 203 (e.g., in the range of µT to nT).

Those of skill in the art will appreciate that the portion of processor chip 200 shown in FIG. 2 may not be drawn to scale. In accordance with the present system, methods and apparatus, processor chip 200 may further include superconducting processing devices, such as superconducting qubits and superconducting couplers, that are not shown in FIG. 2 in order to reduce clutter.

In the presence of an evolving magnetic field, for example a diminishing or compensated magnetic field, SQUIDs 201-203 may be used as follows: SQUID 201 may be used to monitor the magnetic field while it is strongest. As the magnetic field decreases in strength, SQUID 202 may be activated to monitor the magnetic field. As the magnetic field continues to diminish, SQUID 203 may be activated to monitor the magnetic field while it is weakest.

A SQUID is particularly well-suited for measuring magnetic fields that are incident on a planar surface. Most processor chips are predominantly planar in geometry; thus, the present systems, methods and apparatus describe the implementation of at least one SQUID "on-chip" for the purpose of measuring magnetic fields that are incident on the planar surface of a processor chip. For example, for a processor chip that lies in the xy-plane, a SQUID that is integrated predominately on the top or bottom surface (or on an inner-layer surface) in the xy-plane of the processor chip is well-suited to measure magnetic fields in the z-direction. However, such a processor chip may also exhibit some thickness in the z-direction, thereby making it sensitive to magnetic fields in the transverse "x-" and longitudinal "y-" directions. A SQUID that lies in the xy-plane is generally poor at detecting magnetic fields in the x- and y-directions. To address this issue, the present systems, methods and apparatus introduce SQUID designs that may be integrated into a processor chip for the purpose of measuring magnetic fields in the transverse and longitudinal directions.

Throughout this specification, the terms "transverse direction" and "longitudinal direction" are used to refer to the x-direction and y-direction, respectively, of a processor chip that lies in the xy-plane. Those of skill in the art will appreciate that this assignment of the mutually orthogonal x-, y-, and z-directions is arbitrary and not intended to limit the scope of the present systems, methods and apparatus in any way.

FIG. 3A shows an embodiment of a portion of a processor chip 300 in which is integrated a SQUID 301 for measuring magnetic fields in a transverse or longitudinal direction. As illustrated, chip 300 lies in the xy-plane and SQUID 301 is oriented to measure transverse fields in the x-direction. Exemplary transverse fields are illustrated as arrows 310. SQUID 301 operates in a similar way to that described for SQUID 100 from FIG. 1, except that SQUID 301 has been adapted or configured to respond to magnetic fields in the transverse x-direction. The adaptation or configuration of SQUID 301 includes at least one superconducting loop (not visible in FIG. 3A) in the yz-plane such that transverse fields in the x-direction pass through the at least one superconducting loop. In order to establish a superconducting loop in the yz-plane, SQUID 301 is a multilayer structure with superconducting traces on at least two layers of chip 300 (e.g., the top and bottom surfaces of chip 300) connected together by superconducting vias 331 and 332. SQUID 301 also includes two Josephson junctions 311, 312. Two superconducting traces, 341 and 342, are used to connect to the superconducting loop in such a way that Josephson junctions 311 and 312 are connected in parallel. In the illustrated embodiment, trace 341 connects from the top layer to the bottom layer through superconducting via 333, hence a portion is illustrated in broken line.

SQUID 301 is similar in some respects to SQUID 100 from FIG. 1, except that SQUID 301 has been adapted or configured to provide a superconducting loop in the yz-plane. To illustrate the superconducting loop in the yz-plane, FIG. 3B shows a sectional view along the line A-A of FIG. 3A. The structure of SQUID 301 in the yz-plane includes superconducting loop 350, which is formed by a superconducting trace 361 on one layer (e.g., the upper or top layer) of a substrate or chip 300 connected to a superconducting trace 362 on another layer (e.g., the lower or bottom layer) of substrate or chip 300 through two superconducting vias 331 and 332. Thus, superconducting loop 350 forms an area in the yz-plane which is orthogonal to the transverse magnetic fields 310 in the x-direction (coming out of the page) and SQUID 301 therefore responds to transverse magnetic fields in the x-direction. The sectional view of FIG. 3B also shows superconducting via 333 (illustrated in broken or hidden line), which connects to trace 341 (not shown in FIG. 3B).

The superconducting traces 361, 362 and Josephson junctions 311, 312 of SQUID 301 may be formed by, for example, any of a variety of lithographic processes (e.g., deposition, mask, etch, etc.). In the illustrated embodiment, superconducting trace 361 on the top layer of chip 300 is formed using a tri-layer process to include Josephson junctions 311 and 312. Those of skill in the art will appreciate that one or both of Josephson junctions 311 and 312 may similarly be formed in superconducting trace 362 on the bottom layer of chip 300. However, Josephson junctions 311, 312 may be formed by any of a variety of lithographic processes and are not limited to the tri-layer process illustrated in FIG. 3B. In alternative embodiments, chip 300 may include at least one inner layer and at least a portion of superconducting loop 350 may include an inner layer of chip 300.

Those of skill in the art will appreciate that, by rotating chip 300 or SQUID 301 by 90° in the xy-plane, SQUID 301 may be similarly oriented with superconducting loop 350 in the xz-plane to measure longitudinal fields in the y-direction.

As previously discussed, the sensitivity of a SQUID generally increases as the size of its superconducting loop increases. Thus, the sensitivity of SQUID 301 may be increased by increasing the area of superconducting loop 350. However, the space available on a processor chip is limited and extending superconducting traces 361 and 362 transversely or longitudinally across a surface of processor chip 300 can adversely obstruct other devices and components on processor chip 300. The present systems, methods and apparatus provide a compact SQUID design that nevertheless includes a superconducting loop with a large effective area to achieve a high degree of sensitivity in measuring transverse and/or longitudinal magnetic fields.

Figure 4A:
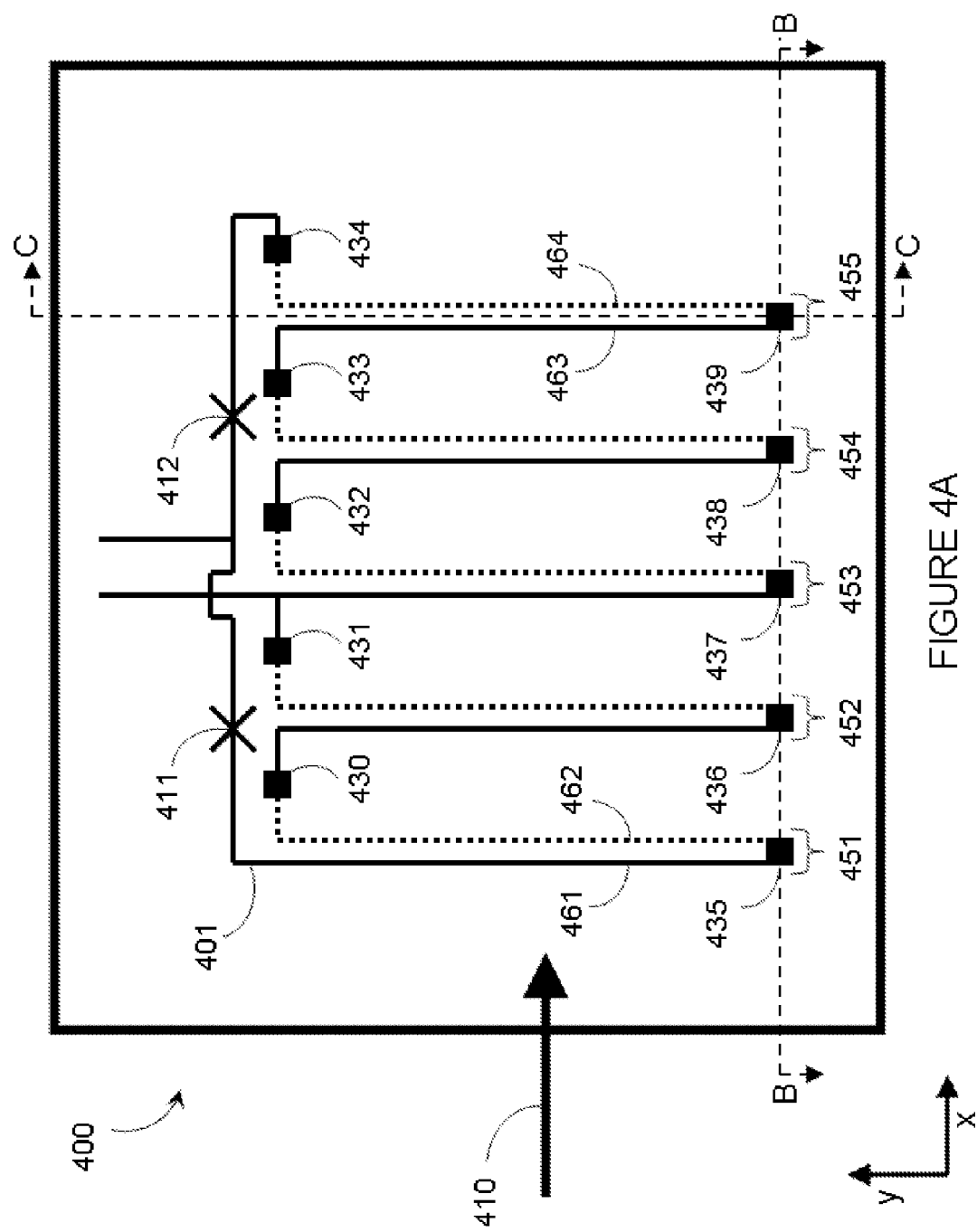
FIG. 4A is a schematic diagram of an embodiment of a processor chip that includes an on-chip SQUID for measuring transverse magnetic fields in the x-direction.

FIG. 4A shows an embodiment of a processor chip 400 that includes an on-chip SQUID 401 for measuring transverse magnetic fields 410 in the x-direction. SQUID 401 is similar in some respects to SQUID 301 from FIGS. 3A and 3B, except that SQUID 401 has been adapted or configured into a more compact design that nevertheless establishes a large effective area of superconducting loop in the yz-plane. As illustrated in FIG. 4A, chip 400 lies in the xy-plane. In order to measure transverse magnetic fields 410 in the x-direction, SQUID 401 includes a plurality of superconducting loops (not visible in FIG. 4A) in the yz-plane that are each orthogonal to the transverse magnetic fields, illustrated by arrow 410. In the illustrated embodiment, the plurality of superconducting loops are co-axially aligned to effectively form a superconducting coil. SQUID 401 may comprise, for example, superconducting traces on at least two surfaces or layers of chip 400, connected together through superconducting vias. In the Figure, superconducting traces on a first surface (e.g., the upper or top surface) of chip 400 are drawn in solid lines and superconducting traces on a second surface (e.g., the lower or bottom surface) of chip 400 are drawn in broken (i.e., hidden) lines. Superconducting vias are represented by black squares 430-439, and SQUID 401 includes two Josephson junction 411 and 412. Each superconducting loop in the yz-plane is established by a respective "finger" 451-455, each of which is formed by a respective pair of superconducting trace segments connected together by a superconducting via. Finger 451, for example, comprises a pair of superconducting trace segments including a first superconducting trace segment 461 carried on the first surface of chip 400 and a second superconducting trace segment 462 carried on the second surface of chip 400. In some embodiments, the first superconducting trace segment 461 may substantially overlay the second superconducting trace segment 462. This is the case for the embodiment shown in FIG. 4A; however, for clarity the first superconducting trace segment 461 and the second superconducting trace segment 462 are shown slightly offset from one another so that both are visible in the Figure.

In the illustrated embodiment, superconducting trace segments 461 and 462 are connected together through superconducting via 435 at the tip of finger 451, and the second superconducting trace segment 462 in finger 451 is connected to finger 452 through superconducting via 430. Thus, the superconducting current path that forms SQUID 401 extends down finger 451, through via 435, up finger 451, through via 430, down finger 452, through via 436, up finger 452, through via 431, and so on through each of fingers 453-455. In this way, each of fingers 451-455 establishes a respective superconducting loop (i.e., closed superconducting current path) predominately in the yz-plane. The formation of superconducting loops in the yz-plane is better seen in sectional views of chip 400.

Figure 4B:
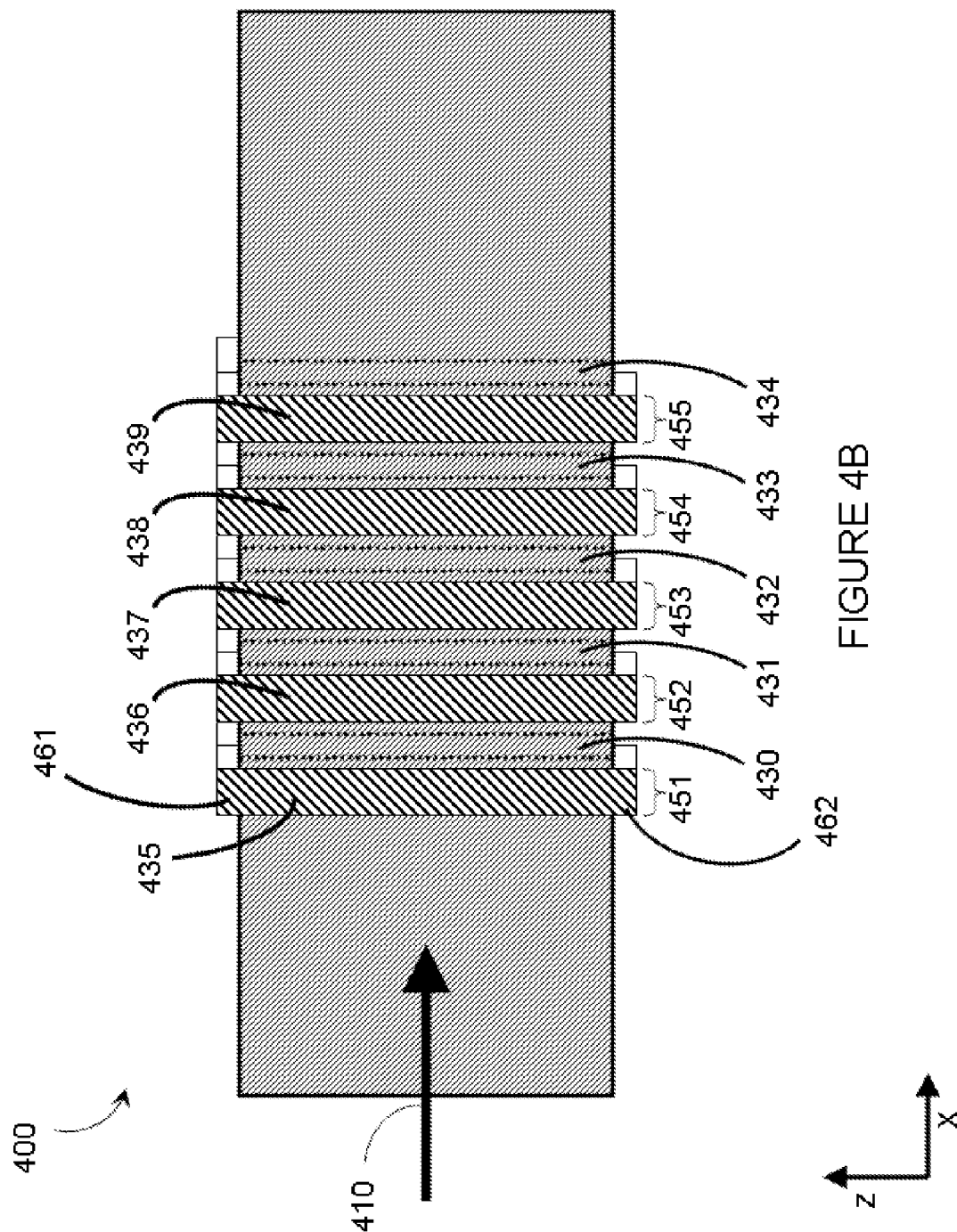
FIG. 4B is a sectional view of the processor chip of FIG. 4A taken along line B-B.

FIG. 4B shows the structure of processor chip 400 in the xz-plane, allowing the paths of vias 430-439 to be seen. The cross-sectional line B-B passes through vias 435-439, therefore these vias are shown in section in FIG. 4B while vias 430-434 are drawn in broken (i.e., hidden) lines. Each of fingers 451-455 comprises a respective pair of superconducting trace segments, with one being carried on a first layer of chip 400 and the other being carried on a second layer of chip 400, connected together through a respective superconducting via 435-439. For example, finger 451 comprises a first superconducting trace segment 461 carried on a first layer of chip 400 that is connected through superconducting via 435 to a second superconducting trace segment 462 carried on a second layer of chip 400. Adjacent pairs of fingers 451-455 are connected together through a respective superconducting via 430-434. For example, finger 451 is connected to finger 452 through via 430, and finger 452 is connected to finger 453 through via 431. In the embodiment shown in FIG. 4B, the first superconducting trace segment (e.g., 461) overlays the second superconducting trace segment (e.g., 462) in each finger without the offset that is used only for the purpose of illustrative clarity in FIG. 4A. Thus, each of fingers 451-455 forms a respective co-axially-aligned superconducting loop in the yz-plane.

Figure 4C:
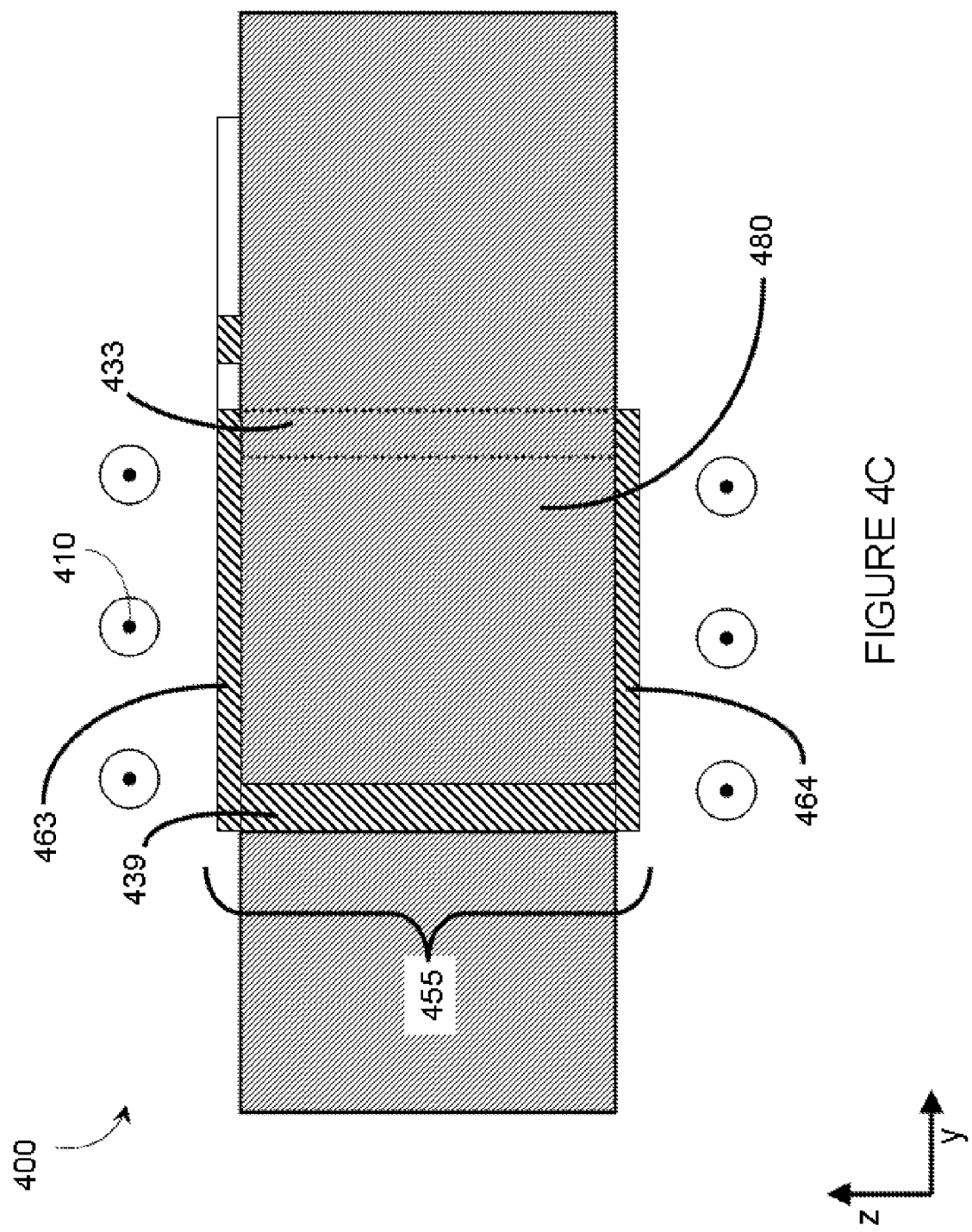
FIG. 4C is a sectional view of the processor chip of FIG. 4A taken along line C-C.

FIG. 4C shows the structure of processor chip 400 in the yz-plane and allows a superconducting loop 480 to be seen. FIG. 4C includes a sectional view of a finger 455, formed by a first superconducting trace segment 463 carried on a first layer of chip 400 that is connected through superconducting via 439 to a second superconducting trace segment 464 carried on a second layer of chip 400. Finger 455 connects to finger 454 through via 433, which is shown in broken (i.e., hidden) lines in FIG. 4C. Thus, a superconducting loop 480 is formed in the yz-plane by finger 455 and via 433, defining an area that is bounded by superconducting trace segments 463 and 464 and vias 439 and 433. Those of skill in the art will appreciate that superconducting loop 480 may similarly be viewed as being formed by finger 455 and via 434 (not visible in FIG. 4C), defining an area that is bounded by superconducting trace segments 463 and 464 and vias 439 and 434. Superconducting loop 480 defines an area that is orthogonal to the x-direction, therefore SQUID 401 responds to the transverse magnetic fields 410 in the x-direction. In a similar way, each of fingers 451-454 also establishes a respective superconducting loop in the yz-plane. As previously discussed, the sensitivity of a SQUID comprising a superconducting loop is influenced by the size of the area bounded by the superconducting loop. In SQUID 401, the total effective area is equal to the sum of the areas of all of the superconducting loops. For example, SQUID 401 includes five fingers with each finger corresponding to a respective superconducting loop that is substantially similar to superconducting loop 480. SQUID 401 therefore provides an effective area of five times the area of superconducting loop 480. In the illustrated embodiments, the respective superconducting loops established by each of fingers 451-455 are aligned co-axially to ensure symmetry and uniformity throughout SQUID 401.

In various embodiments, an on-chip SQUID that is adapted to measure magnetic fields in the transverse or longitudinal direction may include any number of fingers and corresponding superconducting loops. The sensitivity of such an on-chip SQUID is influenced by the sum of the areas of all of the superconducting loops. Thus, a higher degree of sensitivity may be achieved by increasing the area of each superconducting loop and/or by increasing the number of superconducting loops. The area of each superconducting loop may be increased by increasing the lengths of the fingers (e.g., fingers 451-455) or by increasing the separation between layers in chip 400, which may, in some embodiments, correspond to an increase in the lengths of the superconducting vias 430-439. However, the geometry of an on-chip SQUID spanning multiple layers may form additional superconducting loops in alternative planes, and these loops need to be considered in order to ensure accuracy in measurements.

Figure 5:
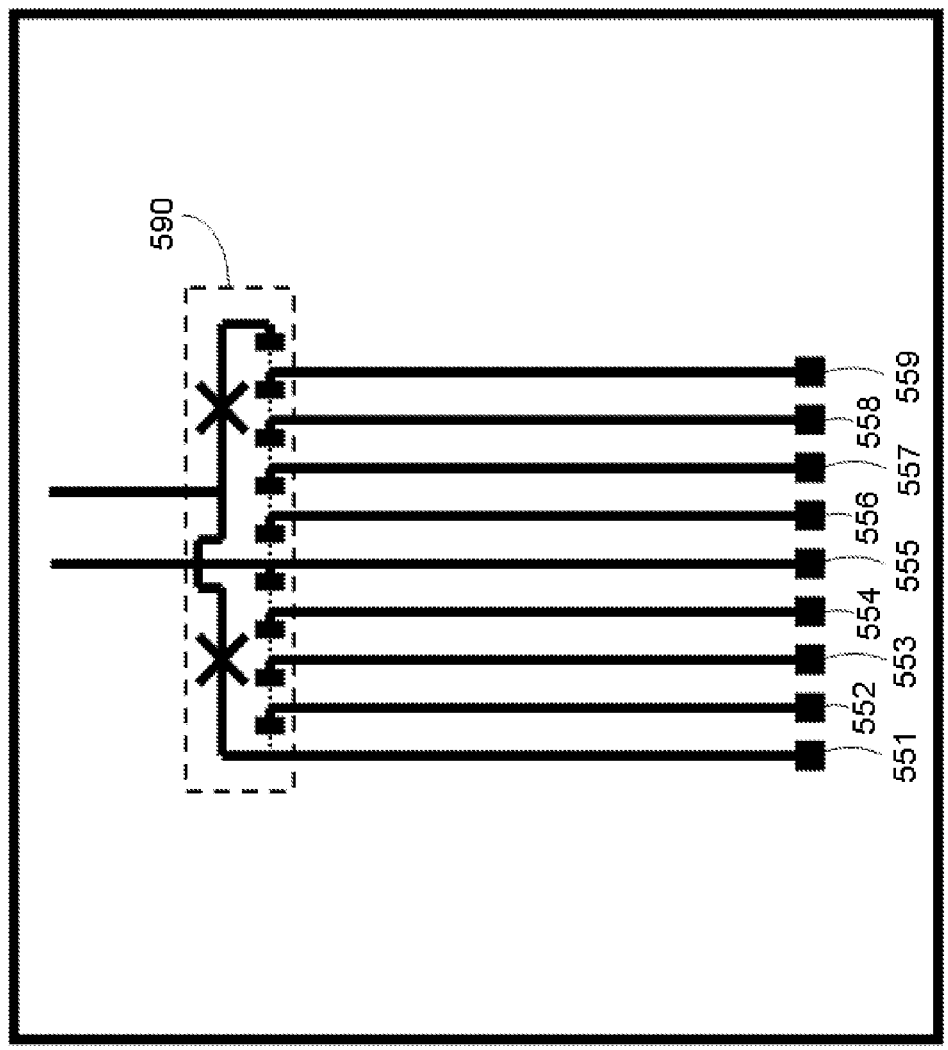
FIG. 5 shows a schematic diagram of a processor chip that includes an on-chip SQUID with nine co-axially-aligned superconducting loops each defining an area in the yz-plane.

FIG. 5 shows a processor chip 500 that includes an on-chip SQUID 501 with nine co-axially-aligned superconducting loops 551-559 each defining an area in the yz-plane. SQUID 501 is a compact structure that provides a high effective area for magnetic field measurements (i.e., the sum of the areas of the nine superconducting loops formed by the nine fingers 551-559) without taking up too much space on chip 500. SQUID 501 is therefore well-suited to measure magnetic fields in the x-direction, and similarly in the y-direction if rotated by 90° in the xy-plane. However, the geometry of SQUID 501 also forms a small superconducting loop 590 in the xy-plane that may respond to magnetic fields in the z-direction. In applications in which a high degree of sensitivity to transverse/longitudinal fields in the x-/y-directions is desired, it may be advantageous to minimize the size of the area of superconducting loop 590 formed in the xy-plane. In some embodiments, it may be advantageous to reduce the coupling of z-fields to superconducting loop 590 by adapting superconducting loop 590 to be gradiometric. In general, when measurements of fields in a particular direction are desired, it may be advantageous to minimize the area of any superconducting loop formed in a plane that is not orthogonal to the direction for which measurements are desired, and/or to incorporate a gradiometric geometry into any such loop.

The present systems, methods and apparatus describe the use of on-chip SQUIDs for the purpose of measuring local magnetic fields. In some embodiments, one or multiple SQUIDs may be used to measure magnetic fields that are normal to the plane of the chip. In some embodiments, one or multiple SQUIDs may be used to measure magnetic fields that are in the plane of the chip, such as transverse and/or longitudinal magnetic fields. Further embodiments of the present systems, methods and apparatus provide multiple on-chip SQUIDs for the purpose of measuring local magnetic fields in multiple directions.

FIG. 6A shows a processor chip 600a including an on-chip system 601a for measuring local magnetic fields in three directions. System 601a includes five on-chip SQUIDs 611a-613a, 620a, and 630a which represent a combination of the embodiments described in FIGS. 2 and 5. SQUIDs 611a-613a are substantially similar to SQUIDs 201-203, respectively, from FIG. 2 and may operate in much the same way. That is, SQUID 611a has small superconducting loop in the xy-plane and may be used as a coarse magnetometer for measuring magnetic fields in the z-direction; SQUID 612a has a medium-sized superconducting loop in the xy-plane and may be used as a magnetometer of moderate sensitivity for measuring magnetic fields in the z-direction; and SQUID 613a has a large superconducting loop in the xy-plane (or, in some embodiments, is a washer SQUID) which may be used as a fine magnetometer for measuring magnetic fields in the z-direction. In addition, SQUID 620a is substantially similar to SQUID 501 from FIG. 5, comprising nine superconducting loops in the yz-plane. SQUID 620a may therefore be used to measure magnetic fields in the x-direction. Similarly, SQUID 630a is substantially similar to SQUID 501 from FIG. 5 except that it has been rotated by 90° about the z-axis. SQUID 630a comprises nine superconducting loops in the xz-plane and may therefore be used to measure magnetic fields in the y-direction. In accordance with the present systems, methods and apparatus, an on-chip system for measuring local magnetic fields such as system 600a may include any number of SQUIDs arranged to measure fields in any combination of directions. Furthermore, such a system may be implemented on any sort of chip or device for which measurement of local fields is desired, not just on the exemplary superconducting processor chips described herein.

Figure 6B:
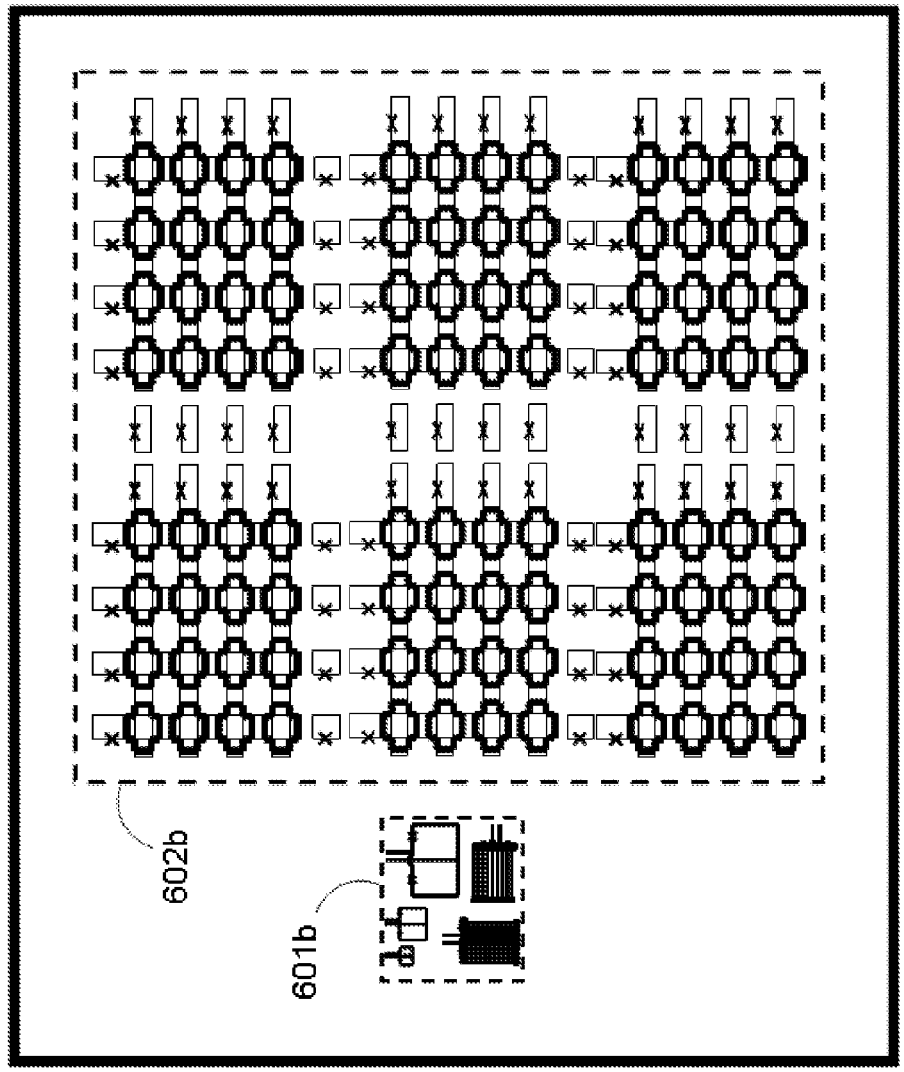
FIG. 6B is a schematic diagram of an embodiment of a processor chip showing an on-chip system for measuring local magnetic fields integrated with superconducting processing components.

As previously described, the processor chip 600a shown in FIG. 6A may not be drawn to scale and other components carried by processor chip 600a (e.g., superconducting qubits and superconducting couplers) are omitted from FIG. 6A. To illustrate the integration of an on-chip system for measuring local magnetic fields, FIG. 6B shows a processor chip 600b including an on-chip system 601b for measuring local magnetic fields and superconducting processing components 602b. Superconducting processing components 602b may form, for example, a superconducting quantum processor such as any of those described in U.S. Pat. No. 7,533,068, US Patent Publication 2008-0176750, US Patent Publication 2009-0121215, or PCT Patent Application Serial No. PCT/US2009/037984. The details of superconducting processing components 602b are outside of the scope of the present systems, methods and apparatus.

As illustrated in FIG. 6B, a single on-chip system 601b for measuring local magnetic fields may provide a good characterization of the magnetic fields at one position on a processor chip 600b. However, in some applications it may be desirable to at least partially characterize any gradients that may exist in the local magnetic fields over the body of the processor chip 600b. In accordance with the present systems, methods and apparatus, this may be achieved by including multiple on-chip systems 601b on a single processor chip. For example, in alternative embodiments processor chip 600b may include any number of on-chip systems 601b for measuring local magnetic fields, such as four on-chip systems 601b with a respective one being positioned in each of the four corners of processor chip 600b. Those of skill in the art will appreciate that gradiometric SQUID designs may also be implemented for the purpose of characterizing local magnetic field gradients.

The various embodiments described herein may be implemented, for example, in measuring magnetic fields for the purpose of magnetic field reduction by compensation. Such compensation may be desired in systems whose components are highly sensitive to magnetic fields, such as for example, superconducting processors and superconducting quantum processors.

An established technique for shielding magnetic fields in sensitive systems is to encase the system in a hollow superconducting cylinder or tube that is closed at one end. Those of skill in the art will appreciate that a "cylinder" generally has a defined shape (i.e., with a circular cross section), while any hollow tubular geometry (e.g., with a non-circular cross section) may similarly be employed. Throughout this specification, the term "cylinder" is used for simplicity and as an exemplary embodiment only. The magnetic fields inside the cylinder may be cancelled out by destructive interference in a compensation procedure. An exemplary compensation procedure may employ at least one compensation coil that is wrapped around the cylinder. At a temperature above the critical temperature of the superconducting cylinder (that is, while the superconducting cylinder is not behaving as a superconductor), the ambient magnetic field inside the cylinder is monitored with a measurement device, such as for example those described in the present systems, methods and apparatus. A dc-current is passed through the compensation coil(s) to produce a compensatory magnetic field that destructively interferes with the ambient magnetic field measured inside the cylinder. Once the desired magnetic field has been produced (e.g., minimized) and maintained inside the cylinder, the temperature of the system is reduced below the critical temperature of the superconducting cylinder such that the cylinder becomes superconducting. When this occurs, the cylinder may naturally trap the magnetic flux that is being generated by the compensation coil(s), thereby locking the compensatory field and allowing the dc-current being applied to the compensation coil(s) to be switched off. A variation of this compensation procedure that utilizes a small superconducting ring in the place of the superconducting cylinder is described in US Patent Publication 2009-0168286.

The various embodiments described herein may be used, for example, to monitor the magnetic fields in the local environment of a processor chip during a compensation procedure. As described above, a compensation procedure may involve generating compensatory magnetic fields that interfere (e.g., destructively) with the local environmental fields and then deliberately cooling the system below its critical temperature in order to trap the compensated level of magnetic flux in a superconducting cylinder. In some embodiments, compensation fields may be generated using a computerized system including, for example, a computer-controlled current source to direct currents through compensation coils. The same computerized system that is used to control the current source may be used to read out the on-chip SQUIDs.

The critical temperature of any superconducting device is dependent (at least in part) on the material of which the device is formed. A superconducting system may include various components that are formed of different materials, and therefore become superconducting at different temperatures. Whenever a particular component becomes superconducting, it can trap the local magnetic fields present at the moment the transition to the superconducting regime is made. In accordance with the present systems, methods and apparatus, it can be advantageous to design a superconducting system so that specific components become superconducting before/after other components as the system is cooled.

As an example, a superconducting system may include a superconducting cylinder that encloses a superconducting processor chip, and the superconducting processor chip may carry on-chip processing devices used to perform computations and on-chip SQUIDs used to measure the local magnetic fields. This exemplary system includes three types of superconducting components: on-chip SQUIDs, on-chip processing devices, and a superconducting cylinder. In some embodiments, it may be advantageous for the on-chip SQUIDs to have a higher critical temperature than both the on-chip processing devices and the superconducting cylinder so that the on-chip SQUIDs are the first to go superconducting while the system is cooled. This enables measurements of the local magnetic fields and allows the effects of compensatory magnetic fields to be monitored before the other components become superconducting and trap the local magnetic fields. Similarly, it may be advantageous for the superconducting cylinder to have a lower critical temperature than both the on-chip processing devices and the on-chip SQUIDs so that the superconducting cylinder is the last to go superconducting while the system is cooled. This way, all compensatory magnetic fields may be tuned (while measuring with the already-superconducting on-chip SQUIDs) and set to their desired levels before the superconducting cylinder transitions to the superconducting regime and traps the compensation fields. The critical temperature of the on-chip processing devices may be in between that of the on-chip SQUIDs and that of the superconducting cylinder.

In alternative embodiments, the on-chip SQUIDs and the on-chip processing devices may share a substantially similar critical temperature (the "chip critical temperature"). In such embodiments, it can still be advantageous to ensure that the chip critical temperature is higher than the critical temperature of the superconducting cylinder so that the on-chip devices become superconducting first. For example, the on-chip SQUIDs and on-chip processing devices may be formed of niobium ($T_c$~9K), while the superconducting cylinder may be formed of tin and/or lead ($T_c$~3.7-7.2K).

In order for on-chip SQUIDs to measure local magnetic fields, they must be superconducting. This means that the chip itself must be cooled below the critical temperature of the on-chip SQUIDs in order for the SQUIDs to work. In some embodiments, cooling the chip below the critical temperature of the on-chip SQUIDs can cause at least one other on-chip device (e.g., an on-chip processing device) to become superconducting. When an on-chip device becomes superconducting, it traps the local magnetic fields. During a compensation procedure, it may be desirable to tune and monitor compensation fields while the system is at a temperature in between the critical temperature of the on-chip SQUIDs (or the chip critical temperature, if the on-chip SQUIDs and other on-chip devices all have substantially the same critical temperature) and the critical temperature of the superconducting cylinder. That is, the effects of varying the compensation fields may be monitored while the on-chip SQUIDs are superconducting but while the superconducting cylinder is not superconducting.

During a compensation procedure, a system needs to be cooled in order to activate the on-chip SQUIDs, and in doing so at least some magnetic flux may be undesirably trapped by an on-chip device. Magnetic flux that has been undesirably trapped by an on-chip device may be released by reheating the chip above the critical temperature of the on-chip device. The process of reheating a chip to release trapped magnetic fields and then re-cooling the chip so that the on-chip SQUIDs become superconducting is referred to herein as "thermal-cycling." In accordance with the present systems, methods and apparatus, the effectiveness of a compensation procedure may be increased by thermal-cycling the chip during an iterative compensation procedure until the desired on-chip fields are achieved. Thermal-cycling the entire system may be costly and inefficient, but localized reheating of the chip itself may be achieved using a local excitation device (i.e., a "heater") such as an LED or a resistor that is positioned in close proximity to the chip.

Figure 7:
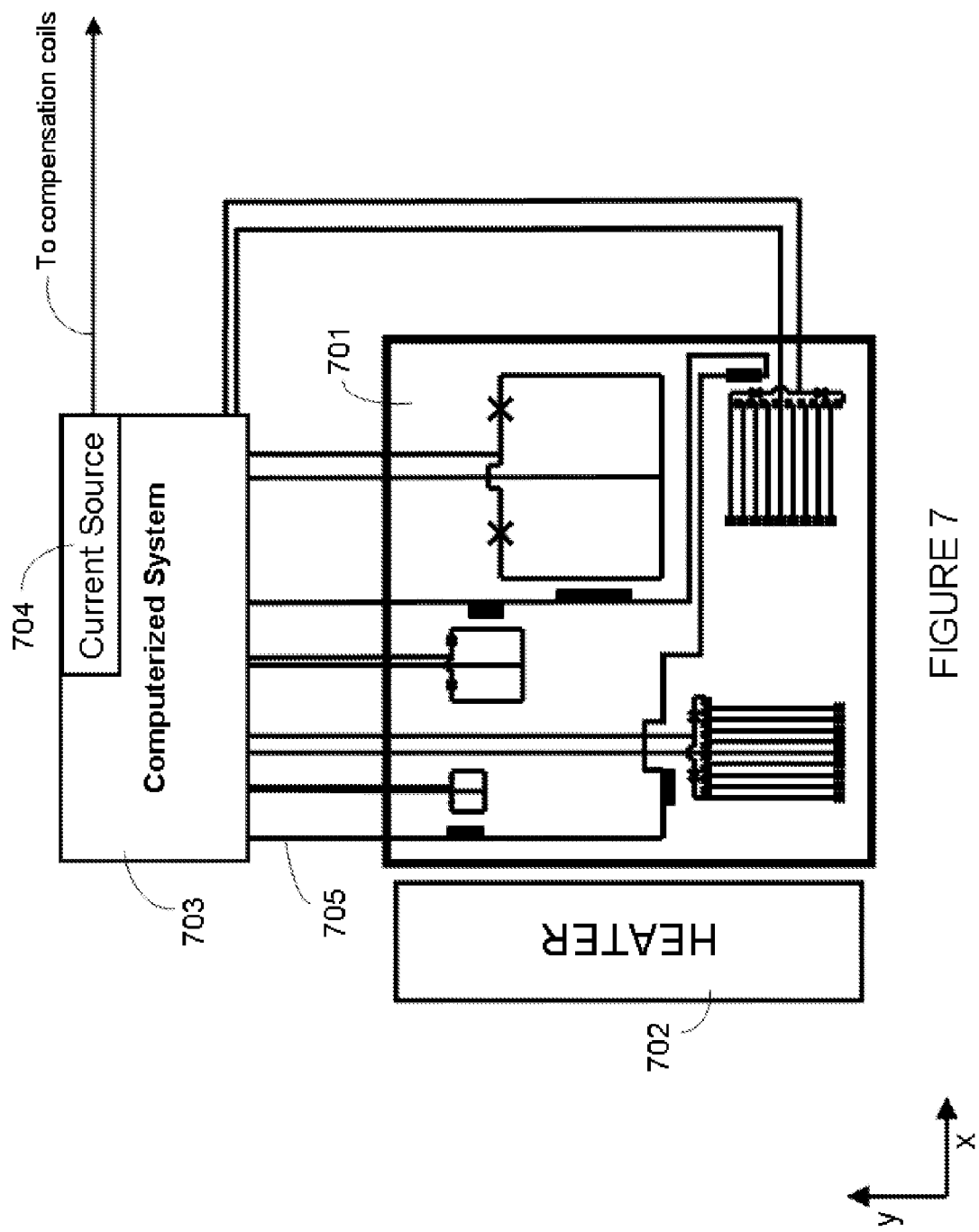
FIG. 7 is a schematic diagram of a processor chip with a local excitation device for resetting the devices on the chip and/or thermal cycling, and a computerized system for controlling SQUID readout and compensation fields.

FIG. 7 shows a processor chip 701 with a local excitation device 702 to enable thermal-cycling and a computerized system 703 for controlling SQUID readout and compensation coil currents. Computerized system 703 is electrically connected to each SQUID on chip 701 and may be used to readout the state of each SQUID. In some embodiments, computerized system 703 may include a computer-controlled current source 704 which is electrically connected to compensation coils (not shown). In such embodiments, computerized system 703 may be used to control the currents through the compensation coils and thereby control the compensation fields. Also shown in FIG. 7 is a modulation line 705 that is configured to inductively couple to each SQUID on chip 701. Those of ordinary skill in the art will appreciate that modulation line 705 may be used, for example, in the calibration and operation of the SQUIDs. In alternative embodiments, multiple modulation lines may be implemented to enable individual control of each or a subset of the SQUIDs.

Excitation device 702 may function as a controllable heater to increase the temperature of the devices on chip 701 above their critical temperature(s) and release trapped magnetic flux. Thus, excitation device 702 may be used to reset the magnetic flux in the superconducting devices carried by chip 701. An exemplary compensation procedure that incorporates thermal-cycling is now described.

In some embodiments, processor chip 701 may be contained in a vacuum environment and gradually cooled by a refrigeration system. When chip 701 is cooled below its critical temperature, on-chip SQUIDs may be activated to measure the magnetic fields in the environment of chip 701. During this superconducting transition, at least some on-chip devices may locally trap magnetic flux. In response to the measurements of on-chip SQUIDs, compensation fields may be generated (e.g., controlled by the same computerized system 703 that controls the readout of the on-chip SQUIDs) to interfere with the local magnetic fields and, for example, cancel out the local magnetic fields. When the compensation fields have been activated, excitation device 702 may be used to heat chip 701 above its critical temperature and reset any magnetic flux trapped by the on-chip devices. Excitation device 702 may then be deactivated to allow chip 701 to re-cool below its critical temperature. This time, when chip 701 becomes superconducting the on-chip devices will trap the environmental fields together with the compensation fields, which should provide an effective magnetic environment that is closer to the desired level of magnetic field (e.g., below a desired level of magnetic field). If the measurements of the on-chip SQUIDs indicate that further adjustments to the compensation fields are desired, then the compensation fields may be adjusted an excitation device 702 may be reactivated to reset the magnetic flux trapped by the on-chip devices. This process of thermal-cycling throughout a reiterative compensation procedure may be continued until the desired magnetic environment is attained. Once the desired magnetic environment is reached, the system may be cooled below the critical temperature of an enclosing superconducting cylinder to trap all of the compensation fields and effectively lock-in the desired magnetic environment. At this point, the controlled currents producing the compensation fields may be switched off.

Figure 8:
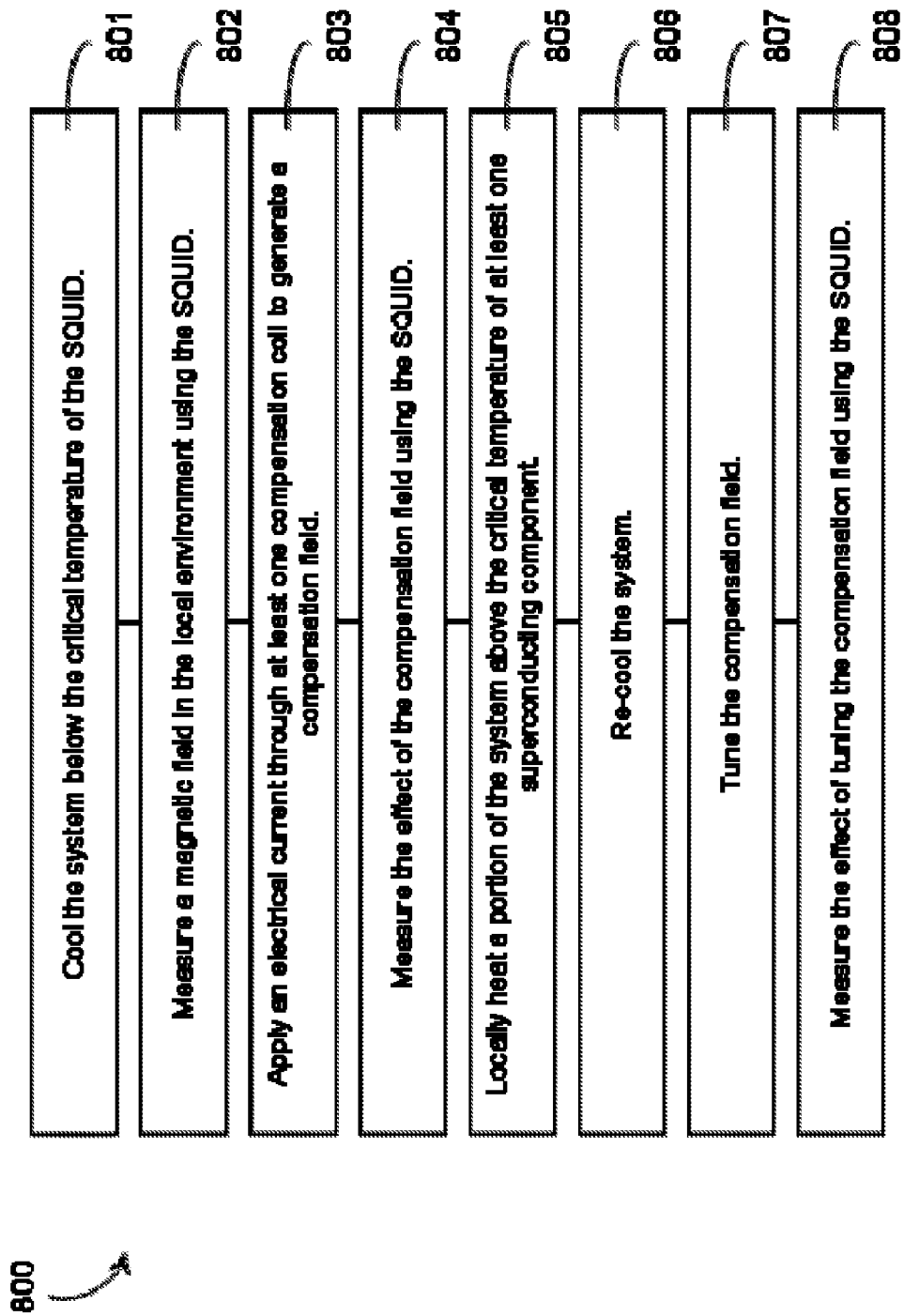
FIG. 8 shows a flow-diagram of an embodiment of a method for establishing tuned compensation fields in the local environment surrounding a system.

The exemplary compensation procedure described above is generalized in FIG. 8. FIG. 8 shows an embodiment of a method 800 for establishing tuned compensation fields in the local environment surrounding a system. The system includes at least one SQUID and at least one compensation coil that is at least partially wrapped around the perimeter of the system. Method 800 includes eight acts 801-808, though those of skill in the art will appreciate that alternative embodiments may omit certain acts and/or include additional acts. In act 801, the system is cooled below the critical temperature of the SQUID. This cooling may be achieved, for example, using a refrigeration system including a dilution refrigerator. In act 802, a magnetic field in the local environment is measured using the SQUID. In some embodiments, this measurement may be controlled using a computerized system to read out the SQUID. In act 803, an electrical current is applied through at least one compensation coil to generate a compensation field. In some embodiments, the electrical current may be controlled by the same computerized system that is used to read out the SQUID such that the correlation between the SQUID read out and the electrical current magnitude may be at least partially automated. In act 804, the effect of the compensation field is measured using the SQUID. In act 805, an excitation device (e.g., a controllable heater) is used to locally heat a portion of the system above the critical temperature of at least one superconducting component. In this way, magnetic flux that is trapped by the at least one superconducting component may be released. In act 806, the system is re-cooled below the critical current of the at least one superconducting component such that the at least one superconducting component returns to a superconducting state. In act 807, the compensation field is tuned by adjusting the electrical current through at least one compensation coil. In act 808, the effect of tuning the compensation field is measured using the SQUID. In some embodiments, acts 805-808 may be repeated until a desired effect of tuning the compensation field is attained. For example, acts 805-808 may be repeated until the magnetic field in the local environment is measured to be at a desired level. In some embodiments, the system may include a hollow cylinder that is formed of a material that becomes superconducting at a lower critical temperature than that of the at least one SQUID. In such embodiments, the cylinder may at least partially enclose the local environment, and once the desired effect of tuning the compensation field has been attained the system may be cooled below the critical temperature of the cylinder. Thus, the cylinder becomes superconducting and traps the desired compensation fields in the local environment. At this point, the electrical current in the at least one compensation coil may be deactivated.

As pointed out in Oppenlander et al., "Non-$\phi_o$-periodic macroscopic quantum interference in one-dimensional parallel Josephson junction arrays with unconventional grating structure", Physical Review B, Volume 63, 024511 (2000), a two-junction dc-SQUID, such as dc-SQUID 100, cannot be directly employed to measure the absolute strength of an external magnetic field. The same is true of an array of N Josephson junctions connected in parallel to define N−1 superconducting loops, provided that the N−1 superconducting loops are each substantially similar in area. This is because the voltage response signal is $\phi_o$-periodic for both the dc-SQUID and the array of N−1 loops when the N−1 loops are each substantially similar in area. However, the absolute strength of an external magnetic field can be measured using an array of N Josephson junctions connected in parallel if the areas of the N−1 superconducting loops differ from one another and are selected in such a way that the voltage response signal becomes non-periodic. Oppenlander et al. describe such an array as an "unconventional grating structure." In the present systems, methods and apparatus, a SQUID that incorporates an unconventional grating structure is referred to as a superconducting quantum interference filter ("SQIF").

Figure 9:
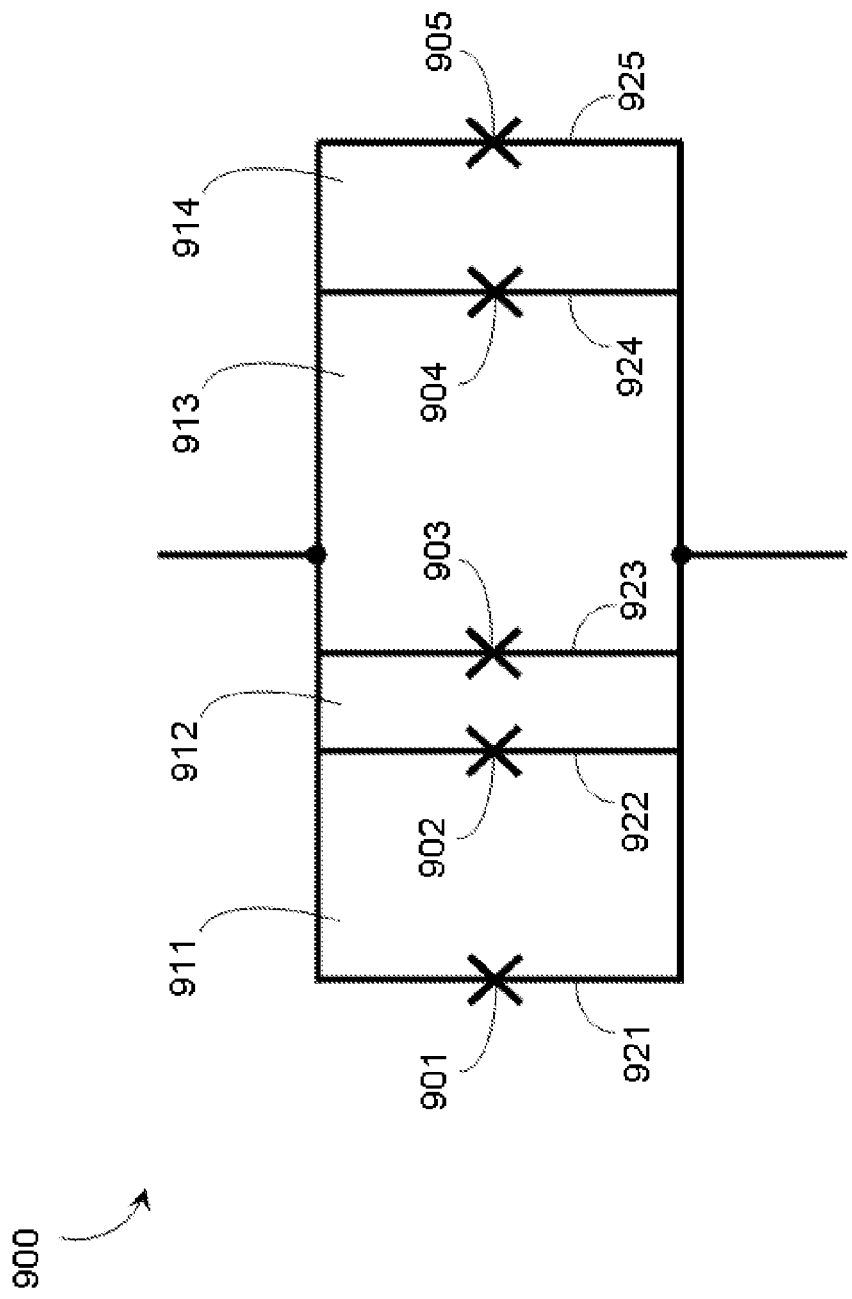
FIG. 9 is a schematic diagram of a superconducting quantum interference filter exhibiting an unconventional grating structure in which an array of five Josephson junctions are connected in parallel to define four superconducting loops that are each different in area.

FIG. 9 is a schematic diagram of a SQIF 900 exhibiting an unconventional grating structure in which an array of five Josephson junctions 901-905 are connected in parallel to define four superconducting loops 911-914 that are each different in area. Each of Josephson junction 901-905 may be said to correspond to an arm 921-925, respectively, in SQIF 900. As described in Oppenlander et al., the differing areas of superconducting loops 911-914 can be made to prevent a coherent superposition of the array arm currents, making the voltage response signal for SQIF 900 non-periodic in applied magnetic fields. This characteristic of SQIF 900 can make it advantageous over alternative magnetometer designs (e.g., dc-SQUID 100) in certain applications. For example, SQIF 900 can be advantageous over dc-SQUID 100 in applications where it is desired to measure the absolute strength of an external magnetic field. Those of skill in the art will appreciate that a SQIF design may include an array of any number N of Josephson junctions connected in parallel to establish N−1 superconducting loops of differing areas. The preferred number of superconducting loops may depend on the desired range and performance of the SQIF design.

Oppenlander et al. present the theoretical operation of the SQIF design (e.g., SQIF 900). However, in practice the physical implementation of a SQIF design can be difficult. Specifically, the successful fabrication of a SQIF requires a fabrication process that can produce Josephson junctions with a high probability of yield. For the purposes of the present systems, methods and apparatus, to "yield" a Josephson junction is to fabricate a Josephson junction that functions substantially in the way in which it was designed to function. A Josephson junction that does not "yield" is said to have failed if it does not function as it was designed to function. In some instances, a failed Josephson junction may, for example, act as a short in the circuit. A failed Josephson junction that behaves as a short in the circuit is said to have "failed to short." In other instances, a failed Josephson junction may, for example, act as an open in the circuit. A failed Josephson junction that behaves as an open in the circuit is said to have "failed to open."

The SQIF presented in Oppenlander et al. implements multiple arms (e.g., arms 921-925) connected in parallel with a single Josephson junction in each arm. A problem with this design is that if a single Josephson junction in a single arm of the SQIF fails to short, then the whole device will not work because there will be a superconducting short across the current leads. In some applications, it may be desired to implement a SQIF with many (e.g., on the order of 10 or 100) arms. Thus, the successful operation of the SQIF presented in Oppenlander et al. relies heavily on the implementation of a superconducting fabrication process that is capable of producing a large number of Josephson junctions with none failing to short.

If a SQIF includes a Josephson junction that fails to open, the SQIF may still function substantially in the way that was intended (or at least, in a useable fashion) because a failure to open simply eliminates one superconducting loop in the device. Furthermore, in some fabrication processes the probability of a Josephson junction failing to short may be greater than the probability of a Josephson junction failing to open. For these reasons, the successful fabrication of a SQIF may depend more strongly on failures to short than on failures to open.

For example, if a fabrication process produces Josephson junctions with a failure-to-short probability of $f_s$ and the SQIF has M arms, then the device will yield with a probability of:

$$P_D = (1-f_s)^M \quad (1)$$

In fabricating a device, it is typically desired to have a high probability of yield. For example, it may be desirable to have a probability of yield of around $P_D \geq 0.95$. For a SQIF with fifty arms (i.e., M=50), a probability of yield of 0.95 necessitates a Josephson junction failure-to-short probability of about 0.001, or one in one thousand. The fabrication of superconducting Josephson junctions is an intricate process and it may generally be desirable to allow for a higher failure-to-short probability than one in one thousand.

In accordance with the present systems, methods and apparatus, a SQIF can be made more robust against shorted Josephson junctions by including more than one Josephson junction in series in each arm. A SQIF with multiple junctions connected in series in each arm is referred to herein as a "modified SQIF." In order for a modified SQIF to fail with a superconducting short across the current leads, every serially-connected junction in at least one arm needs to fail to short. For example (considering only failures-to-short and ignoring failures to open), the probability of yield for a modified SQIF may be given by:

$$P'_D = (1-f_s^n)^M \quad (2)$$

where n is the number of junctions in each arm. A modified SQIF with fifty arms (i.e., M=50) and two junctions per arm (i.e., n=2) necessitates a junction failure-to-short probability of only about 0.03 (or three in one hundred) to achieve a probability of yield of $P'_D = 0.95$. A junction failure-to-short probability of 0.03 is much more easily achievable in a superconducting fabrication facility than a junction failure-to-short probability of 0.001. Thus, a modified SQIF with multiple junctions connected in series in each arm may be more likely to yield than a SQIF with only a single junction in each arm. Those of skill in the art will appreciate that the parameters M=50 and n=2 are used herein only to provide an example. A modified SQIF may include any number of arms M with any number of junctions n>1 connected in series in each arm.

Figure 10:
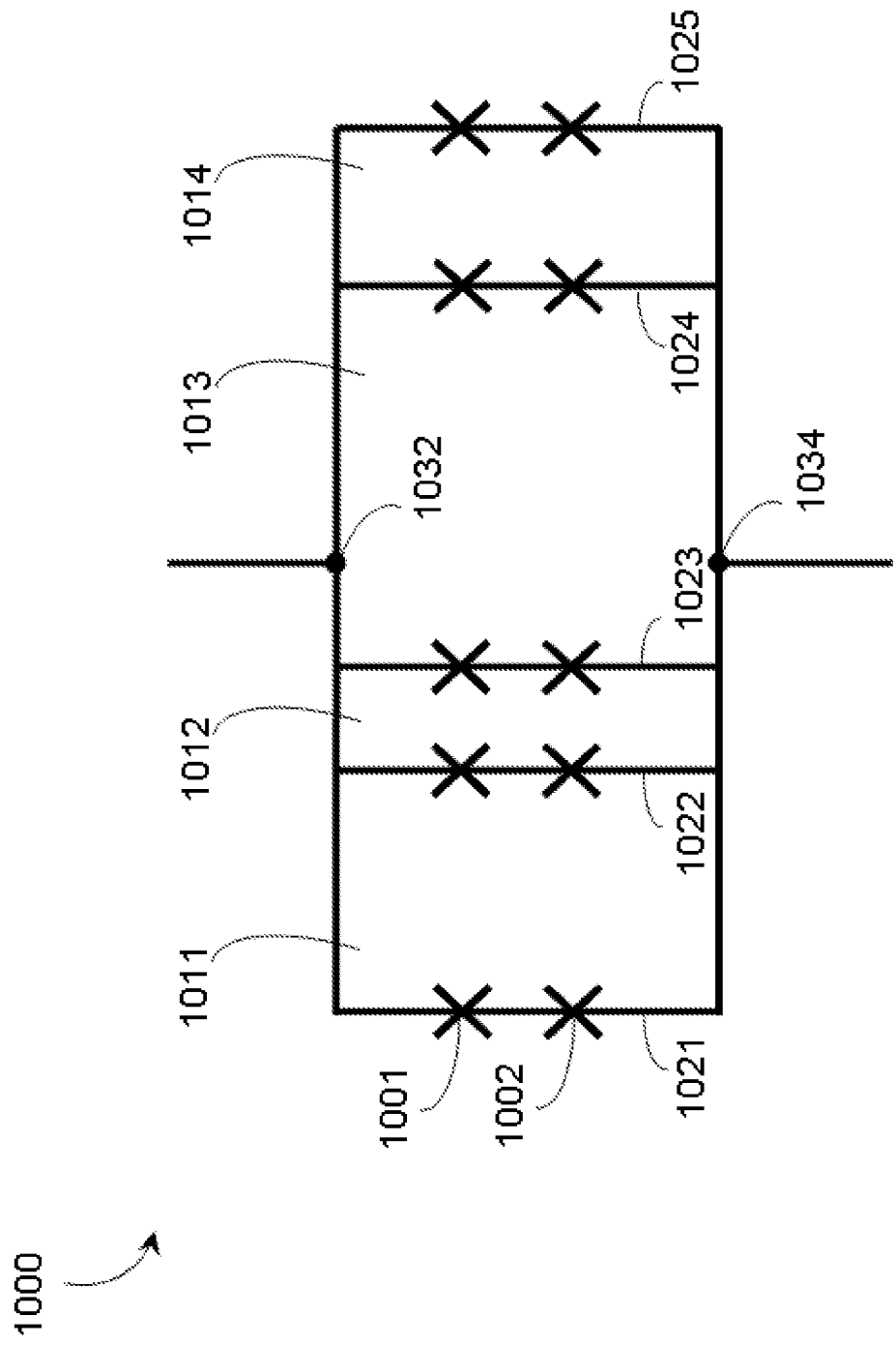
FIG. 10 is a schematic diagram of an embodiment of a modified superconducting quantum interference filter with five arms defining four superconducting loops, where each arm includes two Josephson junctions connected in series.

FIG. 10 is a schematic diagram of an embodiment of a modified SQIF 1000 with five arms 1021-1025 electrically coupled in parallel with each other between two nodes 1032 and 1034, where pairs of adjacently successive ones of the arms 1021-1025 define four superconducting loops 1011-1014, and each of arms 1021-1025 includes two Josephson junctions 1001, 1002 (only two called out in the Figure) connected in series. While illustrated with a number N of 5 arms 1021-1025 and a number N−1 of 4 superconducting loops 1011-1014 enclosing respective areas, the SQIF 1000 may include a greater or lesser number N of arms 1021-1025 and consequently a greater or lesser number N−1 of superconducting loops 1011-1014. As previously described, the fabrication of modified SQIF 1000 may be more likely to yield a functioning device than the fabrication of SQIF 900. This is because modified SQIF 1000 is more robust against shorted Josephson junctions than SQIF 900. SQIF 900 is shorted if any single junction 901-905 fails to short, whereas modified SQIF 1000 is shorted only if both of the junctions in any particular arm 1021-1025 fail to short. For example, arm 1021 of modified SQIF 1000 is shorted only if both junctions 1001 and 1002 are shorted.

A drawback of adding multiple junctions in series in each arm of a modified SQIF is that the visibility of the magnetometry measurement may be reduced. The visibility of SQIF magnetometry measurements may be defined as the ratio between the SQIF's maximum critical current and its minimum critical current. The reduction in visibility caused by including multiple junctions in each arm is dependent on the relative parameters of the junctions that are implemented in any given arm. That is, the reduction in visibility is largest when parametrically identical junctions are used in each arm. Accordingly, the reduction in visibility of magnetometry measurements inherent in a modified SQIF may be lessened by implementing parametrically different junctions in each arm. For example, the reduction in visibility in modified SQIF 1000 may be lessened by ensuring that each of the multiple junctions 1001, 1002 in any given arm 1021-1025 has a different critical current. For example, junctions 1001 and 1002 in arm 1021 may each have a different critical current.

In order to determine the junction failure probability (e.g., failure-to-short probability, $f_s$) of a fabrication process, it is helpful to have a diagnostic device for testing fabrication yields. In accordance with the present systems, methods and apparatus, a standard SQIF (i.e., a SQIF that has only a single junction in each arm) may be used as a coarse diagnostic tool to quickly test the junction failure probability (e.g., $f_s$) of a fabrication process. For example, a number i of SQIFs, each with a arms (i.e., $N_i$ junctions), may be fabricated and subsequently tested for shorts. If a SQIF with $N_1$ junctions has no shorts and a SQIF with $N_2 > N_1$ junctions does have a short, the junction failure-to-short probability, $f_s$, for the fabrication process may be taken as being somewhere in between $1/N_1$ and $1/N_2$.

The various embodiments described herein may be combined to provide further embodiments. For example, a SQIF may be employed as an on-chip SQUID, such as an on-chip SQUID for measuring magnetic fields in any of the x-, y-, or z-directions.

In the various embodiments described herein, it can be advantageous to avoid including sharp corners in the layout of an on-chip SQUID. Sharp corners can be more susceptible to flux-trapping, thus curved or rounded corners may generally be preferred in some embodiments.

Certain aspects of the present systems, methods and apparatus may be realized at room temperature, and certain aspects may be realized at a superconducting temperature. Thus, throughout this specification and the appended claims, the term "superconducting" when used to describe a physical structure such as a "closed superconducting current path" is used to indicate a material that is capable of behaving as a superconductor at an appropriate temperature. A superconducting material may not necessarily be acting as a superconductor at all times in all embodiments of the present systems, methods and apparatus.

The various embodiments described herein may be combined with any or all of the systems, methods and apparatus described in US Patent Publication 2009-0168286, PCT Patent Publication 2009-099972, and US Patent Publication 2009-0122508.

Those of skill in the art will appreciate that the term "planar" is used throughout this specification and the appended claims in a loose sense and should be interpreted as "substantially planar," allowing for slight deviations resulting from the fabrication process, which deviations to not significantly alter the function of the device.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems, methods and apparatus of quantum computation, not necessarily the exemplary systems, methods and apparatus for quantum computation generally described above.

All of the US patents, US patent application publications, US patent applications, foreign patents, foreign patent applications and non-patent publications referred to in this specification and/or listed in the Application Data Sheet, including but not limited to U.S. Provisional Patent Application Ser. No. 61/104,179, filed Oct. 9, 2008, entitled "Systems, Methods and Apparatus for Measuring Magnetic Fields"; U.S. Provisional Patent Application Ser. No. 61/139,983, filed Dec. 22, 2008, entitled "Systems, Methods and Apparatus for Measuring Magnetic Fields"; U.S. Pat. No. 7,533,068; US Patent Publication 2008-0176750; US Patent Publication 2009-0121215; PCT Patent Application Serial No. PCT/US2009/037984; US Patent Publication 2009-0168286; PCT Patent Publication 2009-099972; US Patent Publication 2009-0122508; U.S. Pat. No. 8,812,066; and PCT Patent Publication 2010-042735, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system for measuring magnetic fields, the system comprising:
    a device, the device comprising:
        a first plurality of superconducting quantum interference devices ("SQUIDs"), each SQUID in the first plurality of SQUIDs respectively comprising a closed superconducting current path formed by a material that is superconducting below a first temperature, at least one Josephson junction that interrupts the respective closed superconducting current path, the closed superconducting current path having a longitudinal axis and enclosing a region having a respective area, the longitudinal axes of the SQUIDs in the first plurality of SQUIDs each having a first orientation, and the respective area of the region of a first one of the SQUIDs in the first plurality of SQUIDs is different than the respective area of the region of a second one of the SQUIDs in the first plurality of SQUIDs; and
        a second plurality of SQUIDs each SQUID in the second plurality of SQUIDs respectively comprising a closed superconducting current path formed by a material that is superconducting below a second temperature, at least one Josephson junction that interrupts the closed superconducting current path, the closed superconducting current path having a longitudinal axis and enclosing a region having a respective area, the longitudinal axes of the SQUIDs in the second plurality of SQUIDs a second orientation, the second orientation orthogonal to the first orientation, and the respective area of the region of a first one of the SQUIDs in the second plurality of SQUIDs is different than the respective area of the region of a second one of the SQUIDs in the second plurality of SQUIDs.

2. The system of claim 1 wherein the device is a superconducting processor chip.

3. The system of claim 2 wherein the superconducting processor chip takes the form of a superconducting quantum processor.

4. The system of claim 1 wherein the first temperature is the same as the second temperature.

5. The system of claim 1 wherein the device includes a circuit comprising a closed superconducting current path formed by a second material that is superconducting below a third temperature, wherein the third temperature is below the first or the second temperatures.

6. The system of claim 5, further comprising: a controllable heater positioned sufficiently proximate the device to controllably transfer thermal energy from the controllable heater to the device to raise the temperature of the device above the third temperature and below the first temperature.

7. The system of claim 1, further comprising:
    at least one compensation coil encircling the device; and
    a processor-based system that includes at least one current source electrically coupled to the at least one compensation coil to controllably direct electrical current through the at least one compensation coil to generate a compensation field.

8. The system of claim 7 wherein the processor-based system is electrically coupled to at least one SQUID in the first plurality of SQUIDs for use in reading out the at least one SQUID.

9. The system of claim 1 wherein the device further comprises:
a third plurality of SQUIDs each SQUID in the third plurality of SQUIDs respectively comprising a closed superconducting current path formed by a material that is superconducting below a fourth temperature, at least one Josephson junction that interrupts the closed superconducting current path, the closed superconducting current path having a longitudinal axis and enclosing a region having a respective area, the longitudinal axes of the SQUIDs in the third plurality of SQUIDs each having a third orientation, the third orientation orthogonal to the first orientation, and the respective area of the region of a first one of the SQUIDs in the third plurality of SQUIDs is different than the respective area of the region of a second one of the SQUIDs in the third plurality of SQUIDs.

10. A method of establishing tuned compensation fields, the method comprising:
cooling a system, including a one superconducting quantum interference filter ("SQIF"), below a temperature at which at least a portion of the SQIF superconducts;
measuring a magnetic field at the system via the SQIF;
applying an electrical current through at least one compensation coil that is at least partially wrapped around the system, wherein the electrical current generates a compensation field;
measuring an effect of the compensation field at the system via the SQIF;
heating a portion of the system above a temperature at which at least one superconducting component in the system superconducts to release a magnetic flux trapped by the at least one superconducting component;
re-cooling the system;
tuning the compensation field; and
measuring an effect of tuning the compensation field via the SQIF.

11. The method of claim 10 wherein tuning the compensation field includes adjusting the electrical current through the at least one compensation coil.

12. The method of claim 11 wherein adjusting the electrical current through the at least one compensation coil includes operating a computerized system to adjust the electrical current through the at least one compensation coil.

13. The method of claim 12 wherein measuring an effect of tuning the compensation field reading out the measurements made via the SQIF and the computerized system.

14. The method of claim 10 wherein heating a portion of the system includes activating a local controllable heater.

15. The method of claim 10, further comprising: repeating the heating, re-cooling, tuning, and measuring until a desired compensation field is attained.

16. The method of claim 10, further comprising: further cooling the system below a temperature at which a hollow tube that at least partially encloses the system superconducts to trap the tuned compensation field by the superconducting tube.

17. The method of claim 16, further comprising: deactivating the electrical current through the at least one compensation coil.

18. A superconducting processor comprising:
a substrate;
a first plurality of superconducting quantum interference devices ("SQUIDs") each SQUID in the first plurality of SQUIDs respectively comprising a closed superconducting current path formed by a material that superconducts below a second temperature, the second temperature greater than the first temperature, and having a longitudinal axis, each SQUID in the first plurality of SQUIDs further comprising at least one Josephson junction which interrupts the closed superconducting current path, the longitudinal axes of each SQUID in the first plurality of SQUIDs aligned with each other; and
a controllable heater positioned sufficiently proximate the superconducting current to heat the superconducting current to adjust the temperature of the superconducting current above the first temperature and below the second critical temperature.

19. The system of claim 18 wherein the superconducting processor takes the form of a superconducting quantum processor.

20. The system of claim 18, further comprising:
at least one compensation coil encircling the substrate; and
a computerized system that includes at least one current source that is electrically coupled to the at least one compensation coil to controllably direct electrical current through the at least one compensation coil to generate a compensation field.

21. The system of claim 20 wherein the computerized system is electrically coupled to at least one SQUID in the first plurality of SQUIDs to read out the at least one SQUID.

* * * * *